(12) United States Patent
Hsu

(10) Patent No.: US 11,367,798 B2
(45) Date of Patent: Jun. 21, 2022

(54) POWER ELEMENT

(71) Applicant: Cystech Electronics Corp., New Taipei (TW)

(72) Inventor: Hsin-Yu Hsu, New Taipei (TW)

(73) Assignee: CYSTECH ELECTRONICS CORP., New Taipei (TW)

( * ) Notice: Subject to any disclaimer, the term of this patent is extended or adjusted under 35 U.S.C. 154(b) by 0 days.

(21) Appl. No.: 17/007,092

(22) Filed: Aug. 31, 2020

(65) Prior Publication Data

US 2021/0359144 A1 Nov. 18, 2021

(30) Foreign Application Priority Data

May 14, 2020 (TW) .................................. 109115992

(51) Int. Cl.
| | |
|---|---|
| *H01L 29/866* | (2006.01) |
| *H01L 49/02* | (2006.01) |
| *H01L 27/06* | (2006.01) |
| *H01L 29/78* | (2006.01) |

(Continued)

(52) U.S. Cl.
CPC ........ *H01L 29/866* (2013.01); *H01L 27/0629* (2013.01); *H01L 27/0652* (2013.01); *H01L 28/20* (2013.01); *H01L 29/66106* (2013.01); *H01L 29/66348* (2013.01);
(Continued)

(58) Field of Classification Search
CPC ............... H01L 29/866; H01L 27/0629; H01L 27/0652; H01L 28/20; H01L 29/66106; H01L 29/66734; H01L 29/7397; H01L 29/7813; H01L 29/0696; H01L 29/1095; H01L 29/7375; H01L 29/7393–7395; H01L 29/66325; H01L 29/66333–66348; H01L 29/8086; H01L 29/4236; H01L 29/42352; H01L 29/66613–66628; H01L 29/42356; H01L 29/66113; H01L 29/7808; H01L 29/7821; H01L 29/78696; H01L 27/1225; H01L 27/1255; H01L 29/45; H01L 29/4908; H01L 29/66969; H01L 29/78609; H01L 29/78648; H01L 29/7869; H01L 29/7302; H01L 29/7322;
(Continued)

(56) References Cited

U.S. PATENT DOCUMENTS

2010/0200920 A1 8/2010 Su et al.
2010/0314681 A1* 12/2010 Hsieh .................. H01L 29/7811
257/328

* cited by examiner

*Primary Examiner* — Cuong B Nguyen
(74) *Attorney, Agent, or Firm* — Li & Cai Intellectual Property (USA) Office

(57) ABSTRACT

A power element includes a substrate structure, an insulation layer, a dielectric layer, a transistor, and a plurality of zener diodes. The transistor is located in a transistor formation region of the substrate structure. The plurality of zener diodes are located in a circuit element formation region of the substrate structure and connected in series with each other. Each of the zener diodes includes a zener diode doping structure and a zener diode metal structure. The zener diode doping structure is formed on the insulation layer and is covered by the dielectric layer. The zener diode doping structure includes a P-type doped region and an N-type doped region that are in contact with each other. The zener diode metal structure is formed on the dielectric layer and partially passes through the dielectric layer to be electrically connected to the P-type doped region and the N-type doped region.

10 Claims, 21 Drawing Sheets

(51) Int. Cl.
 *H01L 29/66* (2006.01)
 *H01L 29/739* (2006.01)

(52) U.S. Cl.
 CPC .... *H01L 29/66734* (2013.01); *H01L 29/7397* (2013.01); *H01L 29/7813* (2013.01)

(58) Field of Classification Search
 CPC ... H01L 29/16; H01L 29/861; H01L 27/0664; H01L 29/7803; H01L 29/7804
 See application file for complete search history.

POWER ELEMENT

CROSS-REFERENCE TO RELATED PATENT APPLICATION

This application claims the benefit of priority to Taiwan Patent Application No. 109115992, filed on May 14, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power element, and more particularly to a power element having zener diodes.

BACKGROUND OF THE DISCLOSURE

In the conventional power element, such as a metal-oxide-semiconductor field-effect transistor (MOSFET) and a bipolar junction transistor (BJT), if there is a need to add additional circuit elements (e.g., a resistor or a zener diode) in the circuit design to form an electronic circuit with specific functions, these circuit elements need to be electrically connected to the power element by soldering. However, such a connection method of the circuit elements and the power element will increase the complexity of product manufacture and cannot effectively reduce the size of the product. Furthermore, there are certain limits associated with a design range for an output voltage of the conventional power element.

SUMMARY OF THE DISCLOSURE

In response to the above-referenced technical inadequacies, the present disclosure provides a power element having zener diodes.

In one aspect, the present disclosure provides a power element which includes a substrate structure, an insulation layer, a dielectric layer, a transistor, and a plurality of zener diodes. The substrate structure includes a base layer and an epitaxial layer formed on the base layer. The substrate structure defines a transistor formation region and a circuit element formation region adjacent to the transistor formation region along a length direction of the substrate structure. The insulation layer is formed on the epitaxial layer. The dielectric layer is formed on the insulation layer. The transistor is located in the transistor formation region. The transistor is formed on the substrate structure and partially formed in the substrate structure, the insulation layer, and the dielectric layer. The plurality of zener diodes are located in the circuit element formation region and connected in series with each other. Each of the zener diodes includes a zener diode doping structure and a zener diode metal structure. The zener diode doping structure is formed on the insulation layer and is covered by the dielectric layer. The zener diode doping structure includes a P-type doped region and an N-type doped region that are in contact with each other. The zener diode metal structure is formed on the dielectric layer and partially passes through the dielectric layer to be electrically connected to the P-type doped region and the N-type doped region of the zener diode doping structure. Each of the zener diodes is configured to receive a reverse bias voltage when the power element is energized.

Therefore, in the power element of the present disclosure, the transistor and different electronic elements (e.g., zeners diodes, resistors, and normal diodes) are embedded into a single power element, so that the complexity of the manufacturing process is reduced, and the size of the end product is also reduced.

Further, since the power element of the present disclosure may be designed to include a plurality of zener diodes (and ordinary diodes and/or normal diodes) connected in series with each other, an output voltage $V_{OUT}$ of the power element can be changed by adjusting the number of zener diodes (and the ordinary diodes and/or the normal diodes) to design various power element products with different output voltages. The structural design described above enables a design range of the output voltage to be broader and more variable.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1A:
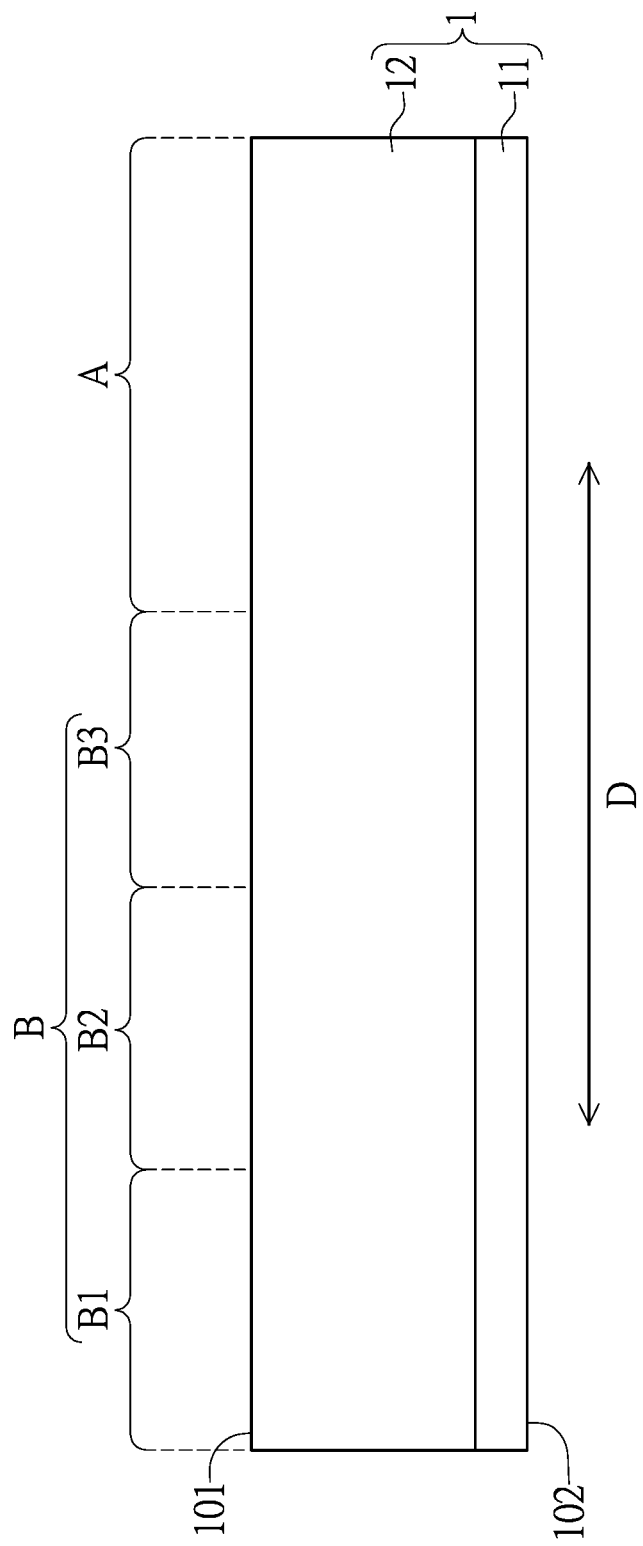
FIG. 1A to FIG. 1H are schematic views showing a method for manufacturing a power element according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1B:
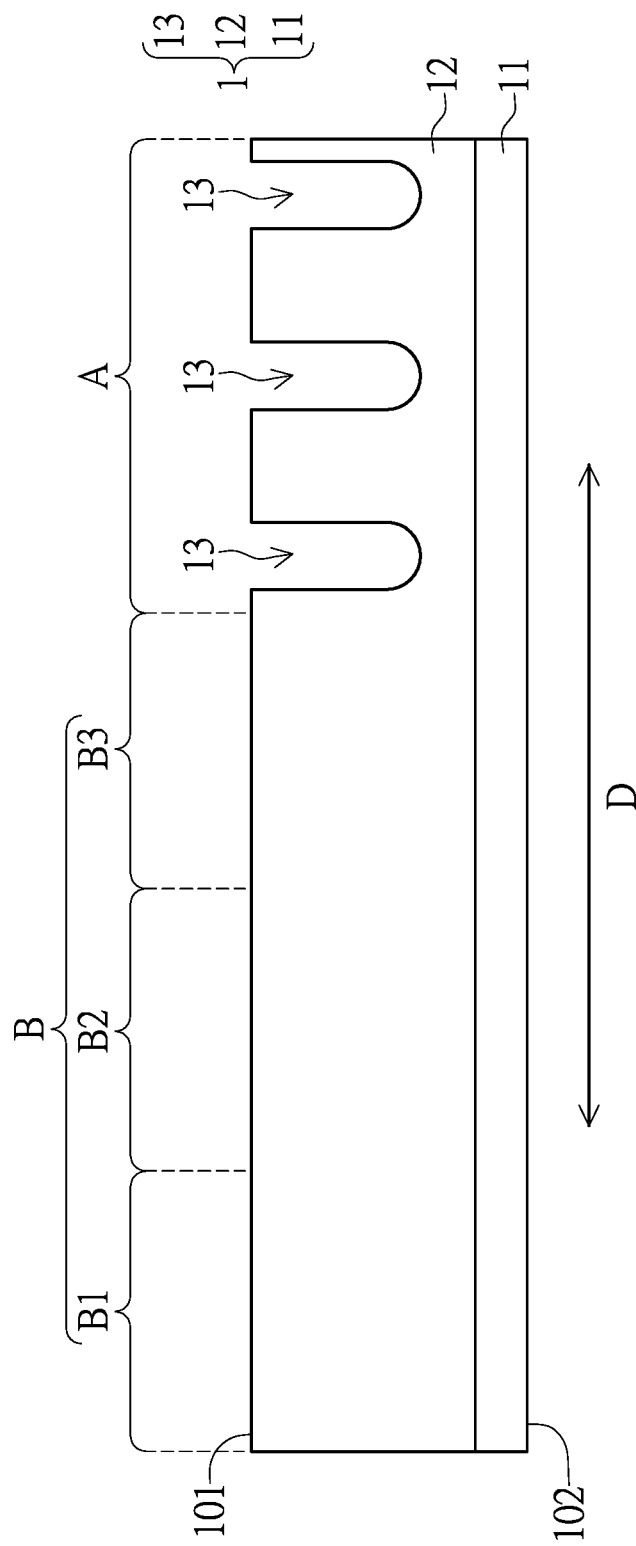
Figure 1C:
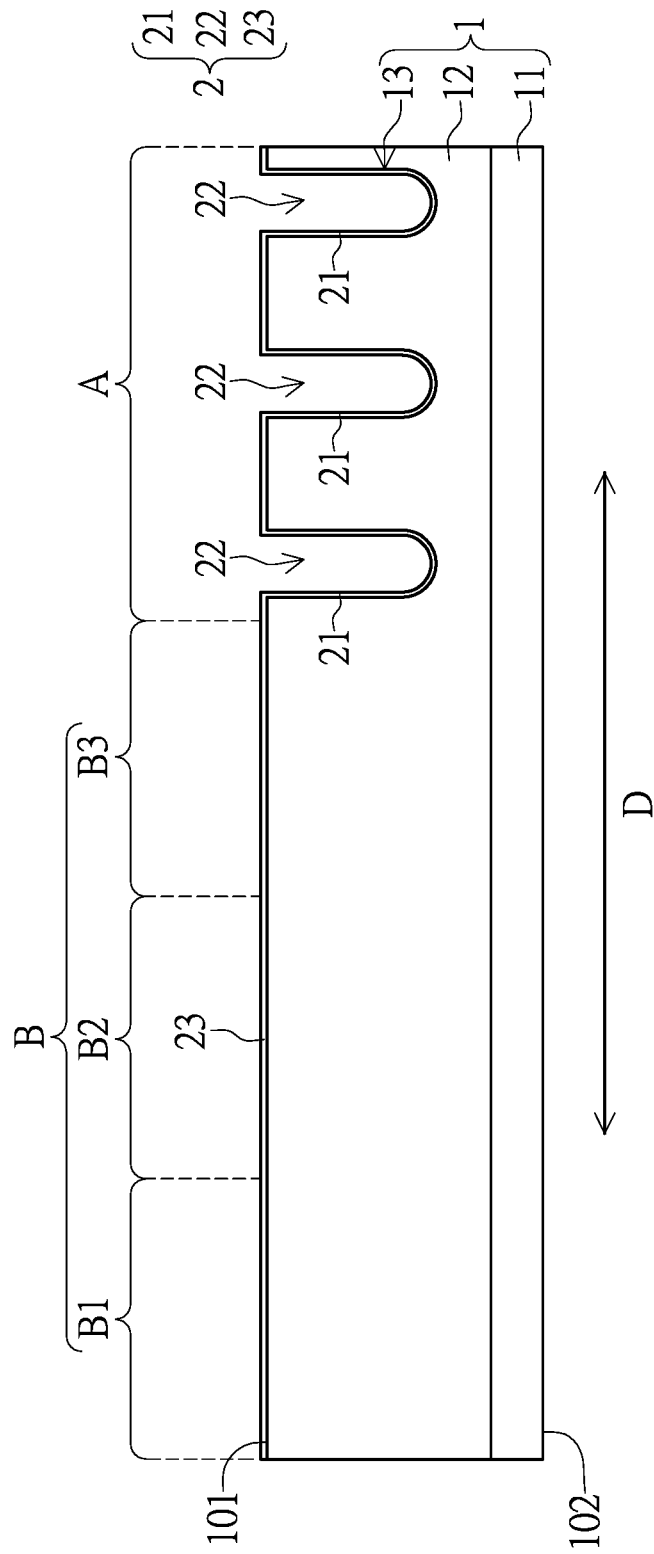
Figure 1D:
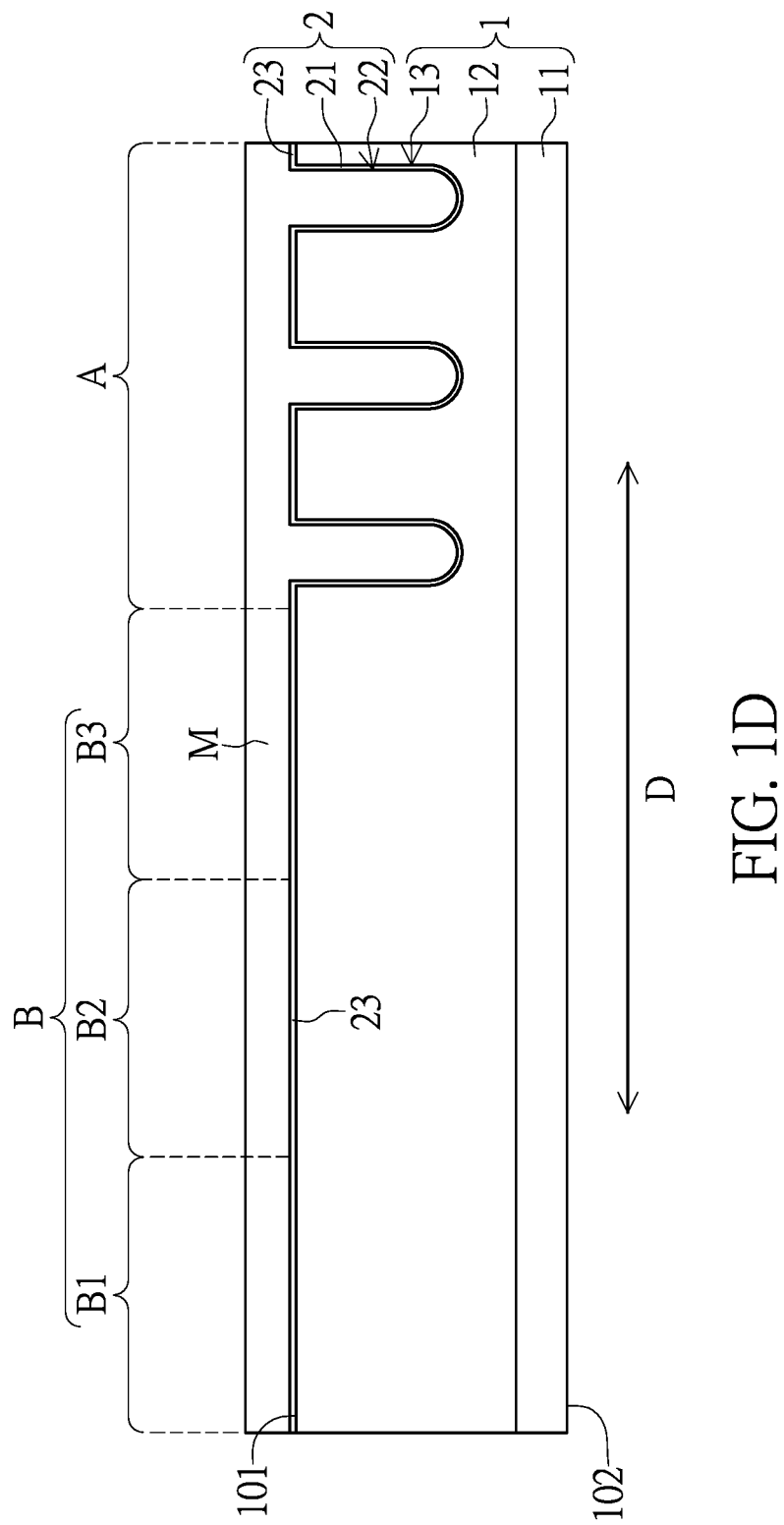
Figure 1E:
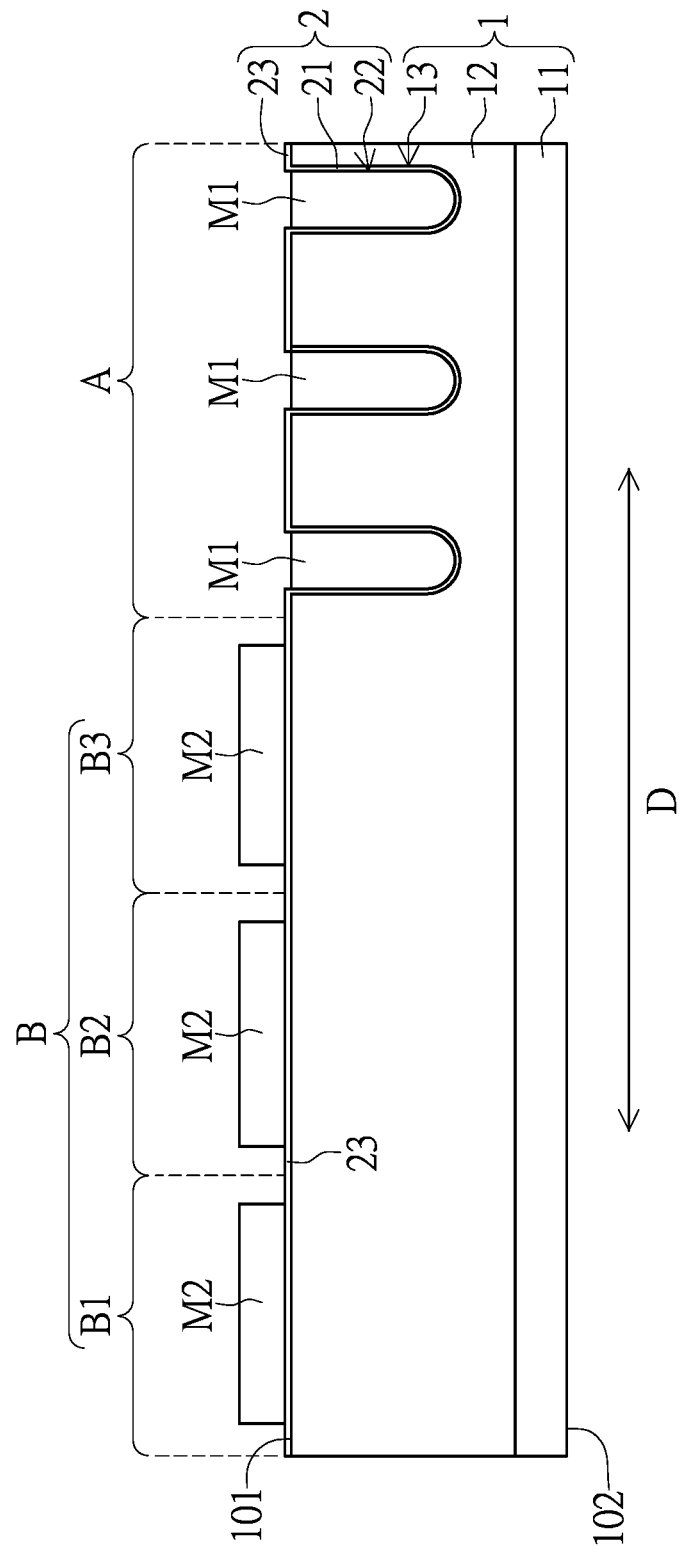
Figure 1F:
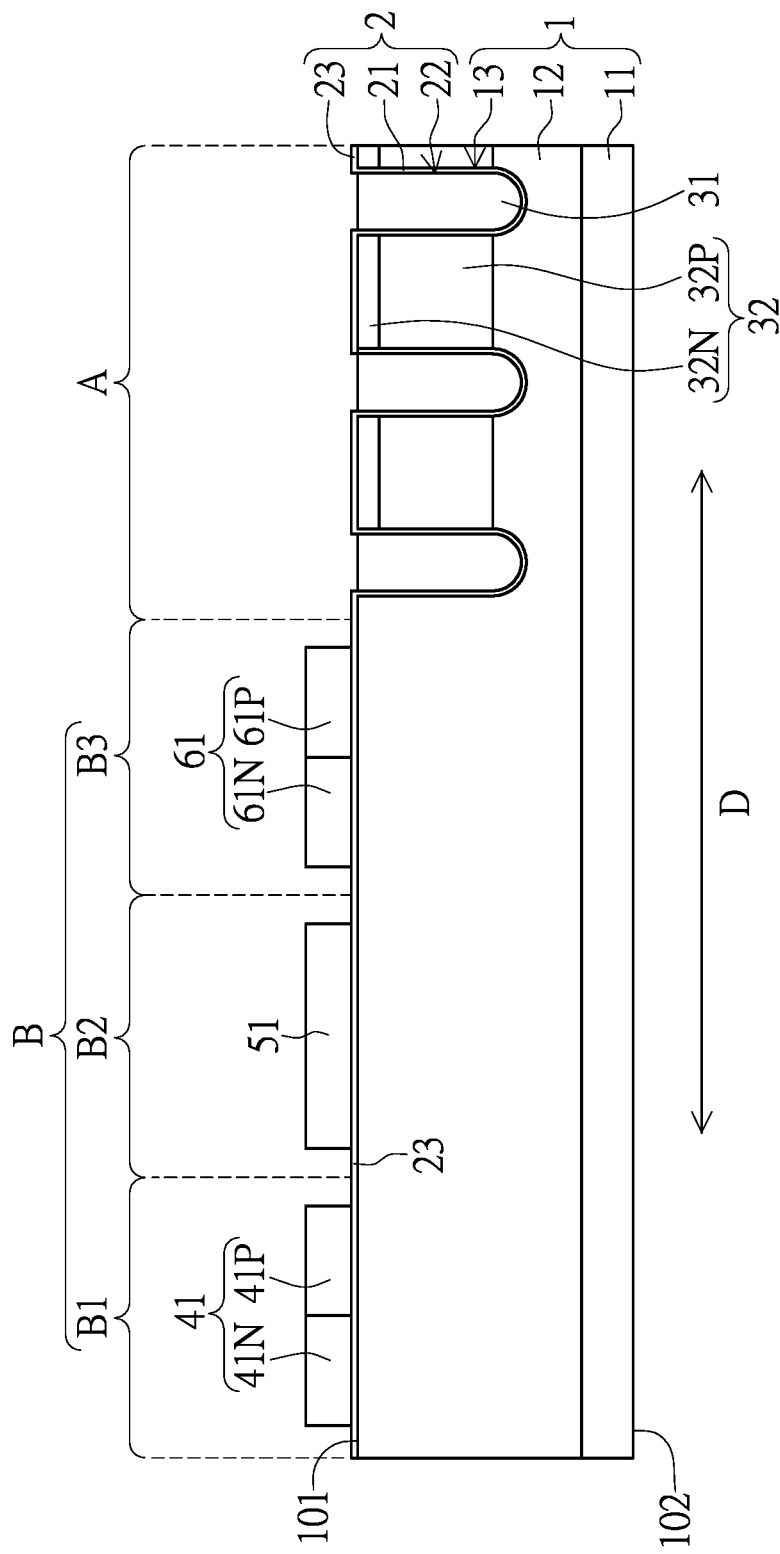
Figure 1G:
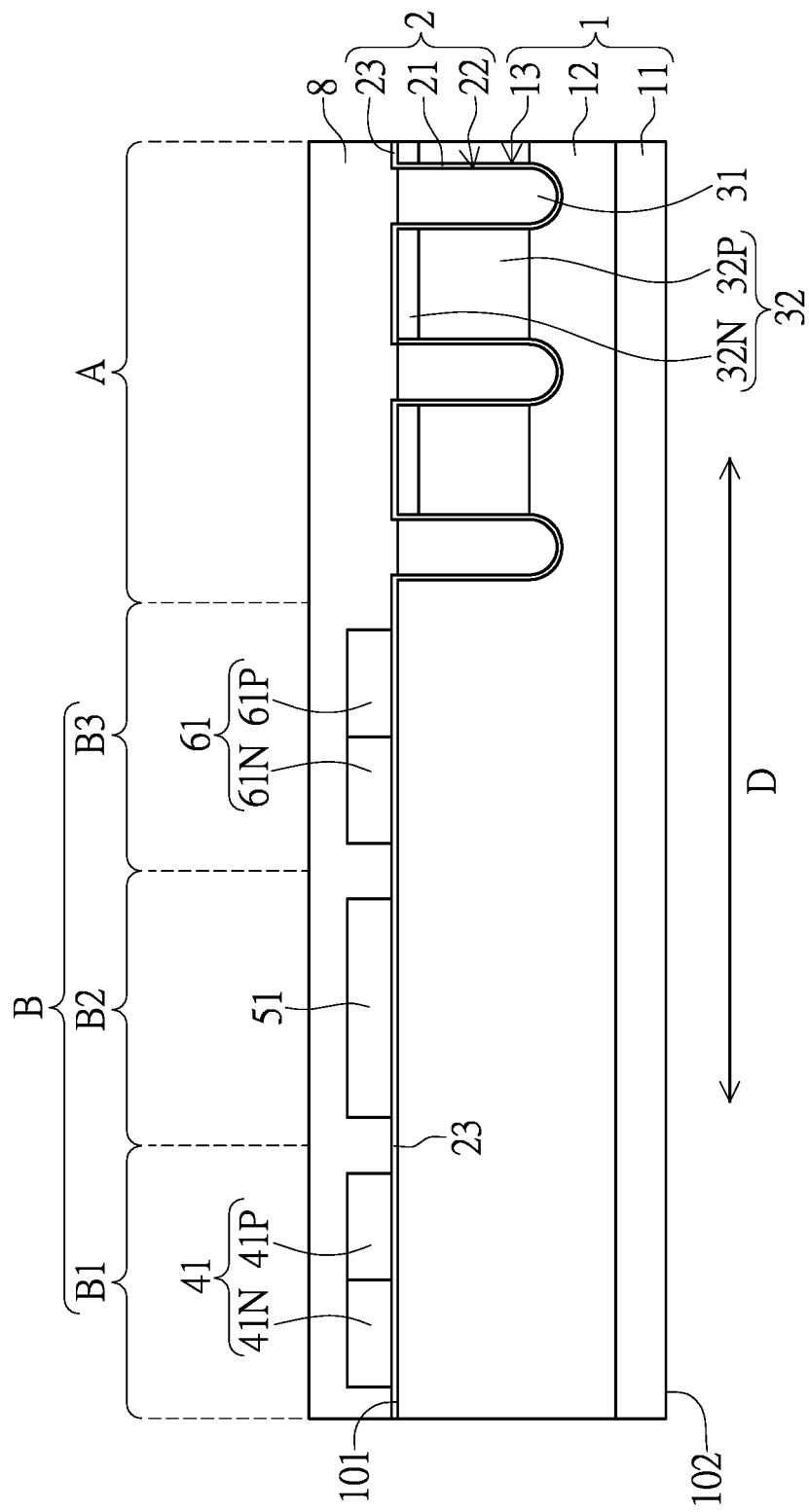
Figure 1H:
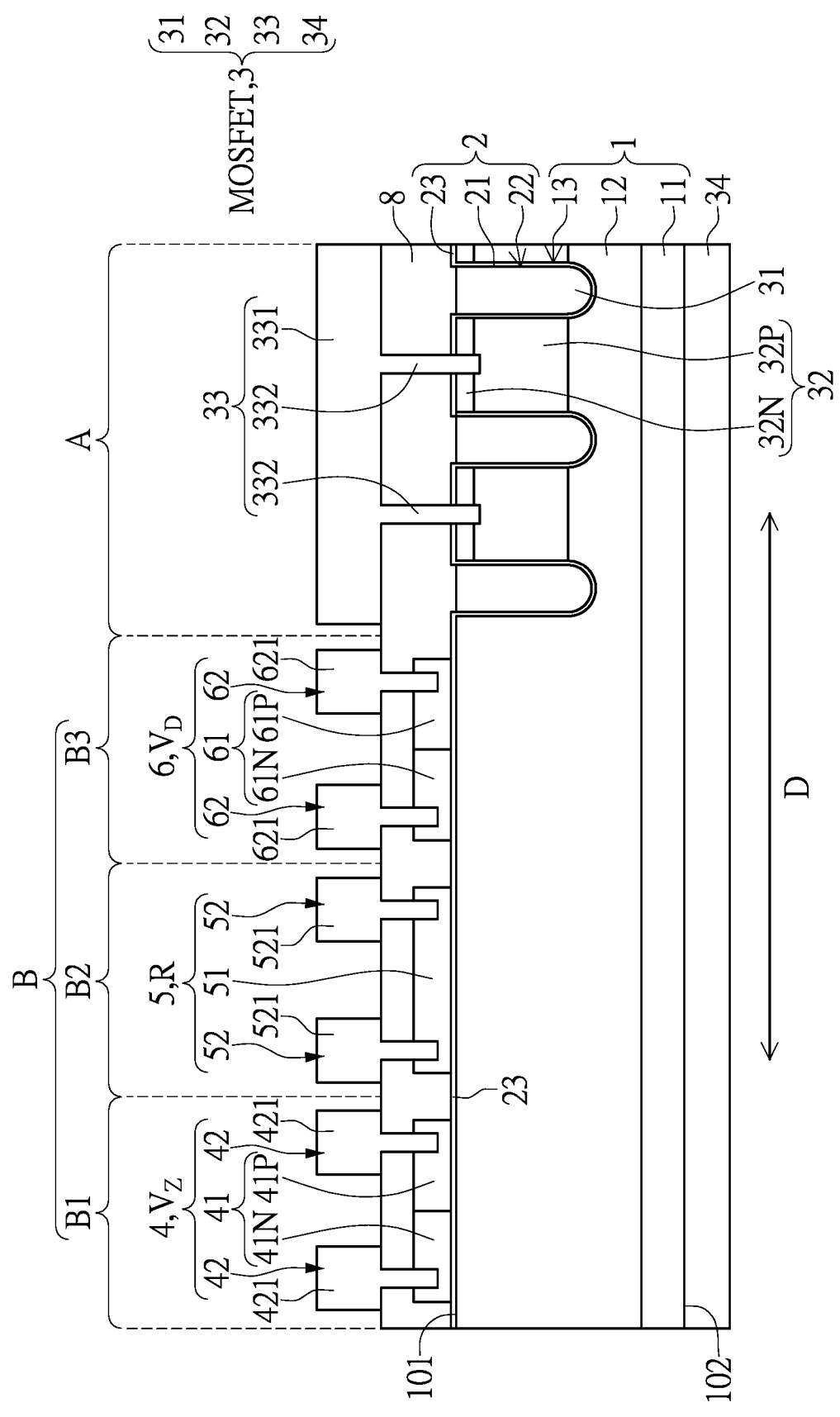
Figure 2:
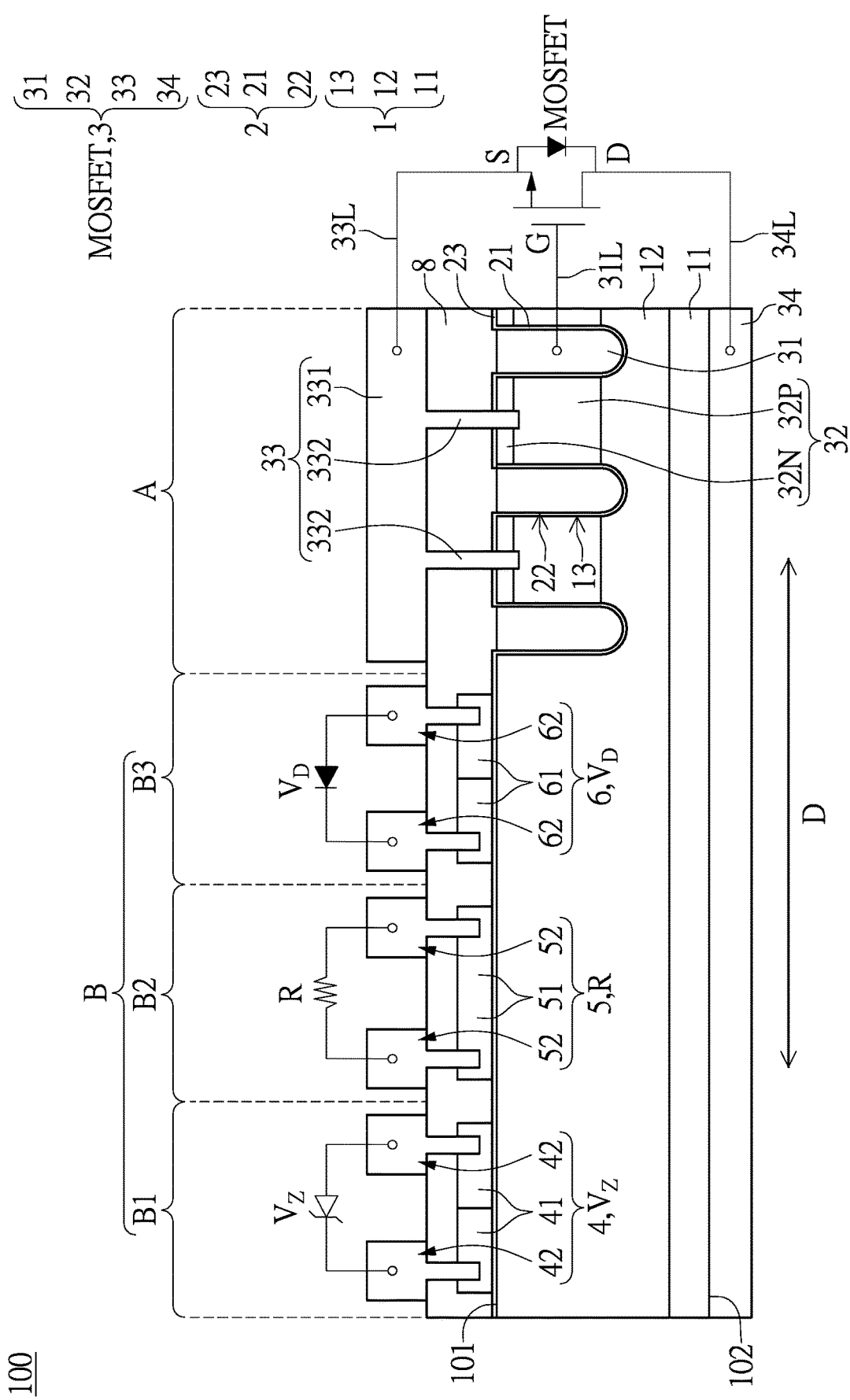
FIG. 2 is a cross-sectional view showing the power element according to the first embodiment of the present disclosure, which also illustrates an equivalent circuit corresponding to the components of the power element.
Figure 3:
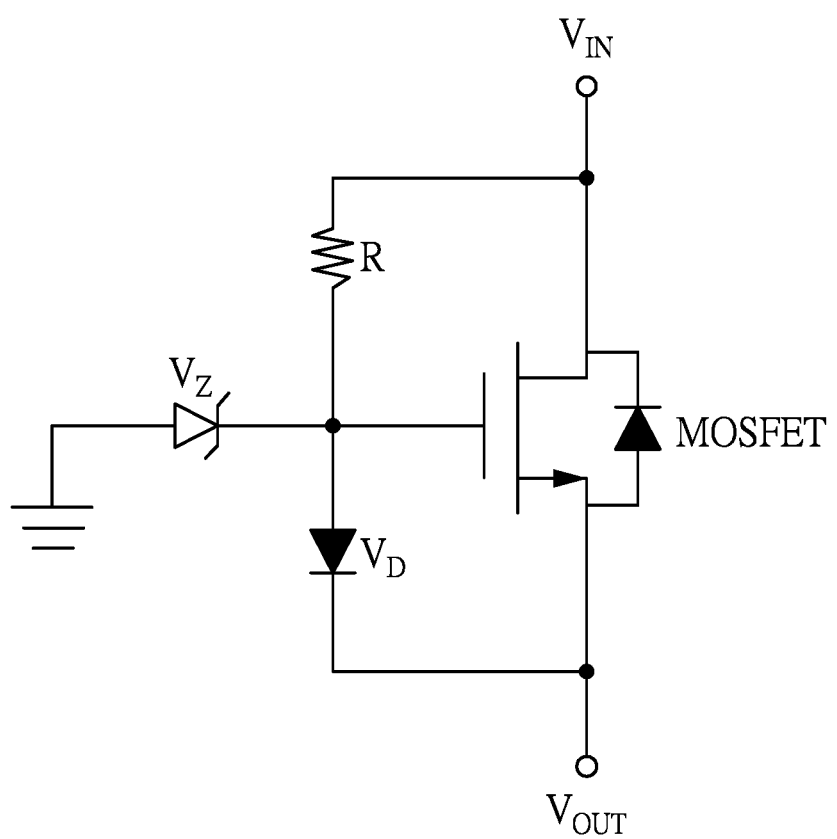
FIG. 3 is an equivalent circuit diagram of the power element according to the first embodiment of the present disclosure.

Referring to FIG. 1A to FIG. 1H, FIG. 2 and FIG. 3, a first embodiment of the present disclosure provides a method for manufacturing a power element 100. The method for manufacturing the power element includes steps S110 to S180. FIG. 1A to FIG. 1H are schematic views showing the method for manufacturing the power element according to the first embodiment of the present disclosure. FIG. 2 is a cross-sectional view showing the power element according to the first embodiment of the present disclosure, which also illustrates an equivalent circuit corresponding to the components of the power element. FIG. 3 is an equivalent circuit diagram of the power element according to the first embodiment of the present disclosure.

It should be noted that the order of the steps and the actual way of operation in the present embodiment can be adjusted according to practical requirements and are not limited to those recited in the present embodiment.

The power element 100 of the present embodiment is a power element based on a metal-oxide-semiconductor field-effect transistor (MOSFET). That is, the power element 100 of the present embodiment is a power element improved by using the metal-oxide-semiconductor field-effect transistor as a basic structure. Furthermore, the power element 100 of the present embodiment may be applied to a high voltage regulator, but the present disclosure is not limited thereto.

In the present embodiment, the method for manufacturing the power element is firstly described below. For ease of understanding, a unit region of the power element is taken as an example, and a cross-sectional view of the unit region is used for explanation. The diagram corresponding to each step can be referred to, as can the diagrams of other steps, if necessary. The specific steps of the method for manufacturing the power element are described below.

Referring to FIG. 1A, the step S110 includes: providing a substrate structure 1. The substrate structure 1 includes a base layer 11 and an epitaxial layer 12 formed on the base layer 11, in which two opposite surfaces of the substrate structure 1 are respectively defined as a top surface 101 and a bottom surface 102. More specifically, the surface of the epitaxial layer 12 away from the base layer 11 is defined as the top surface 101, and the surface of the base layer 11 away from the epitaxial layer 12 is defined as the bottom surface 102.

Further, a material of the base layer 11 may be, for example, an $N^+$-type doped semiconductor or a $P^+$-type doped semiconductor. The epitaxial layer 12 may be formed on the base layer 11 through an epitaxial process, and a conductive type of the epitaxial layer 12 may be the same as a conductive type of the base layer 11 (i.e., $N^+$-type doping or $P^+$-type doping).

In the present embodiment, the base layer 11 is an $N^+$-type doped semiconductor (i.e., $N^+$ substrate), and the epitaxial layer 12 is an $N^-$-type doped semiconductor (i.e., $N^-$ EPI). In addition, a doping concentration of the base layer 11 is greater than that of the epitaxial layer 12. That is, the base layer 11 is a heavily doped region, and the epitaxial layer 12 is a lightly doped region, but the present disclosure is not limited thereto.

Further, the substrate structure 1 defines a transistor formation region A and a circuit element formation region B adjacent to the transistor formation region A along a length direction D of the substrate structure 1. The circuit element formation region B can be further divided into a zener diode formation region B1, a resistor formation region B2, and a normal diode formation region B3.

In the present embodiment, the resistor formation region B2 is located between the zener diode formation region B1 and the normal diode formation region B3. The zener diode formation region B1 is farther from the transistor formation region A than the resistor formation region B2. The normal diode formation region B3 is closer to the transistor formation region A than the resistor formation region B2, but the present disclosure is not limited thereto.

Referring to FIG. 1B, the step S120 includes: forming a plurality of trenches 13 recessed in the epitaxial layer 12, respectively. The plurality of trenches 13 are all located in the above-mentioned transistor formation region A. The plurality of trenches 13 may be formed by etching. More specifically, the plurality of trenches 13 are recessed from the surface of the epitaxial layer 12 away from the base layer 11 at intervals along the length direction D. Further, the bottoms of the plurality of trenches 13 are not in contact with the base layer 11 and are spaced apart from the base layer 11 by a distance. In other words, the plurality of trenches 13 are recessed from the top surface 101 of the base structure 1 and are not in contact with the base layer 11 of the base structure 1.

In the present embodiment, a trench depth of each of the trenches 13 is generally between 0.5 micrometers and 3 micrometers, and preferably between 1 micrometers and 2 micrometers, but the present disclosure is not limited thereto.

It should be noted that the plurality of trenches 13 are described with respect to the trenches 13 at different locations in the epitaxial layer 12 from a sectional perspective. When viewing the power element as a whole, the trenches 13 may be in communication with each other or be separate from each other, and the present disclosure is not limited thereto.

Referring to FIG. 1C, the step S130 includes: extendingly forming an insulation layer 2 (also called oxide layer) on the surface of the epitaxial layer 12 away from the base layer 11 (i.e., the top surface 101 of the substrate structure 1) and the inner walls of the plurality of trenches 13. The insulation layer 2 may be formed by a low temperature oxide deposition (LTO deposition) process or a thermal oxidation process, but the present disclosure is not limited thereto.

In the present embodiment, the thickness of the insulation layer 2 is approximately between 5 nm and 100 nm, and a material of the insulation layer 2 may be, for example, silicon compound. The silicon compound may be silicon dioxide, but the present disclosure is not limited thereto.

Furthermore, a portion of the insulation layer 2 located on the inner wall of each trench 13 is defined as a trench insulation layer 21, and each of the trench insulation layers 21 surrounds a groove 22. That is, the plurality of trench insulation layers 21 are respectively formed on the inner walls of the plurality of trenches 13, and the plurality of trench insulation layers 21 respectively surround the plurality of grooves 22. In addition, the remaining portion of the insulation layer 2 (i.e., a portion of the insulation layer 2 located on the top surface 101 of the epitaxial layer 12) is defined as a cover insulation layer 23.

The plurality of trench insulation layers 21 are all located in the above-mentioned transistor formation region A. The cover insulation layer 23 is extendingly disposed in the above-mentioned transistor formation region A and circuit element formation region B.

Referring to FIG. 1D, the step S140 includes: forming a poly-silicon material M on the surface of the insulation layer 2 away from the epitaxial layer 12 so that the poly-silicon material M covers the cover insulation layer 23 and is filled in the plurality of grooves 22 respectively surrounded by the plurality of trench insulation layers 21. The poly-silicon material M may be formed by silane ($SiH_4$) through a low pressure chemical vapor deposition (LPCVD) process, but the present disclosure is not limited thereto.

In the present embodiment, the poly-silicon material M is deposited to a certain thickness on the insulation layer 2 so that the outer surface of the poly-silicon material M (i.e., a surface of the poly-silicon material M away from the base layer 11) is a flat surface. More specifically, portions of the outer surface of the poly-silicon material M above the plurality of grooves 22 and the cover insulation layer 23 are substantially flush with each other, but the present disclosure is not limited thereto.

Referring to FIG. 1E, the step S150 includes: performing a lithography imaging operation and an etching operation on the poly-silicon material M to remove portions of the poly-silicon material M. Accordingly, a plurality of poly-silicon filling structures M1 are respectively formed in the plurality of grooves 22 surrounded by the plurality of trench insulation layers 21, and a plurality of poly-silicon block structures M2 are formed on the cover insulation layer 23.

In the present embodiment, since the plurality of poly-silicon filling structures M1 are respectively formed in the plurality of grooves 22 surrounded by the plurality of trench insulation layers 21, the plurality of poly-silicon filling structures M1 are the same as the plurality of trench insulation layers 21, which are all located in the above-mentioned transistor formation region A.

Further, after the plurality of poly-silicon filling structures M1 are etched, the exposed surfaces of the plurality of poly-silicon filling structures M1 (i.e., the top surfaces of the poly-silicon filling structures M1 in FIG. 1E) are lower than the outer surface of the cover insulation layer 23 (i.e., a surface of the cover insulation layer 23 away from the epitaxial layer 12 in FIG. 1E), but the present disclosure is not limited thereto.

In addition, the plurality of poly-silicon block structures M2 are all formed on the surface of the cover insulation layer 23 away from the epitaxial layer 12, and the plurality of poly-silicon block structures M2 are all located in the above-mentioned circuit element formation region B, so as to be manufactured into different circuit elements (e.g., zener diodes, resistors, normal diodes, etc.) in the subsequent manufacturing process.

Further, the plurality of poly-silicon block structures M2 are arranged at intervals on the cover insulation layer 23. In the present embodiment, the number of the plurality of poly-silicon block structures M2 is three. The three poly-silicon block structures M2 are respectively located in the zener diode formation region B1, the resistor formation region B2, and the normal diode formation region B3 of the circuit element formation region B.

It is worth mentioning that, in the present embodiment, raw materials M of the poly-silicon filling structures M1 and the poly-silicon block structures M2 are formed in the same poly-silicon deposition process, but the present disclosure is not limited thereto. The raw materials M of the poly-silicon filling structures M1 and the poly-silicon block structures M2 can also be formed respectively through multiple poly-silicon deposition processes (e.g., 2, 3, or more processes) according to process requirements.

Referring to FIG. 1F, the step S160 includes: implementing an ion implantation process, so that the plurality of poly-silicon filling structures M1 located in the transistor formation region A are respectively formed as a plurality of gate filling structures 31 (also called doped poly-silicon filling structures), a portion of the epitaxial layer 12 between any two adjacent trenches 13 is formed as a matrix doping structure 32, the poly-silicon block structure M2 located in the zener diode formation region B1 is formed as a zener diode doping structure 41, the poly-silicon block structure M2 located in the resistor formation region B2 is formed as a resistor doping structure 51, and the poly-silicon block structure M2 located in the normal diode formation region B3 is formed as a normal diode doping structure 61. It is worth mentioning that, in the present embodiment, in order to perform different doping procedures (e.g., P-type doping or N-type doping) on the poly-silicon materials M1, M2 and the epitaxial layer 12, the ion implantation process may include, for example, multiple ion implantation procedures which include P-type doped ion implantation procedure and N-type doped ion implantation procedure.

Further, each of the gate filling structures 31 may be, for example, one of a P-type doped semiconductor and an N-type doped semiconductor, and the present disclosure is not limited thereto.

Each of the matrix doping structures 32 includes a P-type doped region 32P and an N-type doped region 32N formed on the P-type doped region 32P. That is, in each of the matrix doping structures 32, the N-type doped region 32N and the P-type doped region 32P are stacked to each other. The P-type doped region 32P is located on the lower side and is in contact with the epitaxial layer 12. The N-type doped region 32N is located on the upper side and is in contact with the cover insulation layer 23. It is worth mentioning that the conductive type of the P-type doped region 32P is different from the conductive type of the base layer 11 ($N^+$ type doped semiconductor), and is also different from the conductive type of the epitaxial layer 12 ($N^-$ type doped semiconductor). That is, the plurality of P-type doped regions 32P in the present embodiment are P-type doped semiconductors. The implanted ion type may be, for example, boron ions (B+), but the present disclosure is not limited thereto.

The zener diode doping structure 41 includes a P-type doped region 41P and an N-type doped region 41N located at one side of the P-type doped region 41P (i.e., the left side of the P-type doped region 41P as shown in FIG. 1F). That is, in the zener diode doping structure 41, the N-type doped region 41N and the P-type doped region 41P are respectively arranged on left and right sides, and are in contact with each other. Furthermore, both the N-type doped region 41N and the P-type doped region 41P are formed on the cover insulation layer 23 and are in contact with the cover insulation layer 23.

The resistor doping structure 51 may be, for example, one of a P-type doped semiconductor and an N-type doped semiconductor. In the present embodiment, the resistor doping structure 51 is preferably a P-type doped semiconductor, but the present disclosure is not limited thereto. Furthermore, the doping concentration of the resistor doping structure 51 is lower than the doping concentration of the zener diode doping structure 41 or the doping concentration of the normal diode doping structure 61 to produce the effect of resistance.

The normal diode doping structure 61 is similar to the zener diode doping structure 41, and includes a P-type doped region 61P and an N-type doped region 61N located at one side of the P-type doped region 61P (i.e., the left side of the P-type doped region 61P as shown in FIG. 1F). That is, in the normal diode doping structure 61, the N-type doped region 61N and the P-type doped region 61P are respectively arranged on left and right sides, and are in contact with each other. Furthermore, both the N-type doped region 61N and the P-type doped region 61P are formed on the cover insulation layer 23 and are in contact with the cover insulation layer 23.

It should be noted that the ions used in the ion implantation process described herein may be, for example, boron ions ($B^+$), zinc ions ($Zn^{2+}$), fluoride ions ($F^-$), nitrogen ions ($N^-$), oxygen ions ($O^{2-}$), carbon ions ($C^{4+}$), argon ions ($Ar^+$), phosphorus ions ($P^+$), arsenic ions ($As^+$), or antimony ions ($Sb^{2+}$).

Referring to FIG. 1G, the step S170 includes: forming a dielectric layer 8 (inter layer dielectric, ILD) on the substrate structure 1 so that the insulation layer 2, the plurality of gate filling structures 31, the matrix doping structures 32, the zener diode doping structure 41, the resistor doping structure 51 and the normal diode doping structure 61 are covered by the dielectric layer 8.

The dielectric layer 8 may be formed by a chemical vapor deposition process, but the present disclosure is not limited thereto. For example, the dielectric layer 8 may also be formed by a physical vapor deposition process or other suitable deposition processes. Furthermore, a material of the dielectric layer 8 may be, for example, a silicon compound or other dielectric materials.

Further, an outer surface of the dielectric layer 8 may be planarized by a chemical mechanical polishing (CMP) process, but the present disclosure is not limited thereto.

Referring to FIG. 1H, the step S180 includes: performing a metallization process to respectively form a source metal structure 33, a zener diode metal structure 42, a resistor metal structure 52 and a normal diode metal structure 62 on the dielectric layer 8, and to form a drain metal structure 34 on the bottom surface 102 of the substrate structure 1. It should be noted that the "metal structure" mentioned herein may be formed by deposition, and the "metal structure" may be an integrated structure formed of an aluminum/silicon/copper alloy, but the actual application of the present disclosure is not limited thereto.

The source metal structure 33 is located in the transistor formation region A. The source metal structure 33 is formed on a surface of the dielectric layer 8 away from the base layer 11 and partially passes through the dielectric layer 8 to be electrically connected to at least one of the plurality of matrix doping structures 32.

In the present embodiment, the source metal structure 33 includes a source metal conductive portion 331 and two source metal contact plugs 332 connected to the source metal conductive portion 331. The source metal conductive portion 331 is formed on the surface of the dielectric layer 8 away from the base layer 11. The two source metal contact plugs 332 are spaced apart from each other and respectively pass through the dielectric layer 8, so that the source metal conductive portion 331 can be electrically connected to two adjacent matrix doping structures 32 among the plurality of matrix doping structures 32 through the two source metal contact plugs 332.

In addition, a width of each of the source metal contact plugs 332 is smaller than a width of the corresponding matrix doping structure 32 connected thereto. Each of the source metal contact plugs 332 passes through the N-type doped region 32N of the corresponding matrix doping structure 32 and partially extends into the P-type doped region 32P. In this way, the two source metal contact plugs 332 are equipotential compared to the two matrix doping structures 32 that they are electrically connected to.

The drain metal structure 34 is formed on the bottom surface 102 of the substrate structure 1. That is, the drain metal structure 34 is formed on the surface of the base layer 11 away from the epitaxial layer 12. In the present embodiment, the drain metal structure 34 fully covers on the bottom surface 102 of the substrate structure 1, but the present disclosure is not limited thereto.

According to the above configuration, as shown in FIG. 2, the source metal structure 33 can be used to electrically connect a source wire 33L (or a source pin) to define a source S of the metal-oxide-semiconductor field-effect transistor (MOSFET). The drain metal structure 34 can be used to electrically connect a drain wire 34L (or a drain pin) to define a drain D of the metal-oxide-semiconductor field-effect transistor. In addition, one of the plurality of gate filling structures 31 (i.e., the rightmost gate filling structure in FIG. 2) can be used to electrically connect a gate wire 31L (or a gate pin) to define a gate G of the metal-oxide-semiconductor field-effect transistor. The above-mentioned components (i.e., the source metal structure 33, the drain metal structure 34, the gate filling structure 31, etc.) located in the transistor formation region A can together form the metal-oxide-semiconductor field-effect transistor 3, and the equivalent circuit diagram is shown in FIG. 3.

Referring to FIG. 1H again, the zener diode metal structure 42, the resistor metal structure 52, and the normal diode metal structure 62 are all located in the circuit element formation region B.

The zener diode metal structure 42 is located in the zener diode formation region B1. The zener diode metal structure 42 is formed on the surface of the dielectric layer 8 away from the base layer 11 and partially passes through the dielectric layer 8 to be electrically connected to the zener diode doping structure 41. The zener diode metal structure 42 and the zener diode doping structure 41 can be matched with each other to form a zener diode 4 ($V_Z$). The zener diode 4 is configured to receive a reverse bias voltage, and the zener diode 4 can withstand a voltage between 5 volts and 6 volts.

In the present embodiment, the zener diode metal structure 42 includes two metal pins 421. The two metal pins 421 of the zener diode metal structure 42 are spaced apart from each other, and both partially pass through the dielectric layer 8 to be respectively and electrically connected to the N-type doped region 41N and the P-type doped region 41P of the zener diode doping structure 41, so that the zener diode 4 is formed. In the zener diode 4, a potential of the metal pin 421 connected to the P-type doped region 41P is "lower" than a potential of the metal pin 421 connected to the N-type doped region 41N, thereby generating a "reverse bias voltage" when the power element 100 is energized.

The resistor metal structure 52 is located in the resistor formation region B2. The resistor metal structure 52 is formed on the surface of the dielectric layer 8 away from the base layer 11 and partially passes through the dielectric layer 8 to be electrically connected to the resistor doping structure 51. The resistor metal structure 52 and the resistor doping structure 51 can be matched with each other to form a resistor 5 (R).

In the present embodiment, the resistor metal structure 52 includes two metal pins 521. The two metal pins 521 of the resistor metal structure 52 are spaced apart from each other, and both partially pass through the dielectric layer 8 to be electrically connected to the resistor doping structure 51 (e.g., P-type doped semiconductor). The doping concentration of the resistor doping structure 51 is lower than that of the zener diode doping structure 41 and also lower than that of the normal diode doping structure 61, thereby generating a resistance when the power element 100 is energized.

The normal diode metal structure 62 is located in the normal diode formation region B3. The normal diode metal structure 62 is formed on the surface of the dielectric layer 8 away from the base layer 11 and partially passes through the dielectric layer 8 to be electrically connected to the normal diode doping structure 61. The normal diode metal structure 62 and the normal diode doping structure 61 can be matched with each other to form a normal diode 6 ($V_D$). The normal diode 6 is configured to receive a forward bias voltage, and the normal diode 6 can withstand a voltage between 0 volts and 0.7 volts.

In the present embodiment, the normal diode metal structure 62 includes two metal pins 621. The two metal pins 621 of the normal diode metal structure 62 are spaced apart from each other, and both partially pass through the dielectric layer 8 to be respectively and electrically connected to the N-type doped region 61N and the P-type doped region 61P of the normal diode doping structure 61, so that the normal diode 6 is formed. In the normal diode 6, a potential of the metal pin 621 connected to the P-type doped region 61P is "higher" than a potential of the metal pin 621 connected to the N-type doped region 61N, thereby generating a "forward bias voltage" when the power element 100 is energized.

It is worth mentioning that in the normal diode 6 of the present embodiment, the metal pin 621 connected to the P-type doped region 61P can be electrically connected to one of the plurality of gate filling structures 31 (i.e., the right-most gate filling structure in FIG. 2) through a wire (not shown). Furthermore, the metal pin 621 connected to the N-type doped region 61N can be electrically connected to the source metal structure 33 of the metal-oxide-semiconductor field-effect transistor 3 through a wire (not shown), but the present disclosure is not limited thereto.

It is also worth mentioning that, in the present embodiment, the N-type doped region 32N of the matrix doping structure 32, the N-type doped region 41N of the zener diode 4, and the N-type doped region 61N of the normal diode 6 are completed in the same ion implantation procedure, but the present disclosure is not limited thereto.

After implementing the above steps S110 to S180, the power element 100 (also referred to as a trench-type power element) shown in FIG. 1H and FIG. 2 can be completed. The equivalent circuit diagram of the power element 100 of the present embodiment is shown in FIG. 3. It should be noted that, in practical application, each step may be substituted with a reasonable variation.

Furthermore, it should be noted that the above steps are described from the perspective of a sectional view. Under the premise that conditions in the above steps are met, the possibility of implementing the present disclosure in various design layouts is not excluded. In other words, if viewed from a top view, the power element 100 of the present disclosure may have different design layouts.

According to the above configuration, the method for manufacturing the power element according to the embodiment of the present disclosure can have the formations of different electronic components (e.g., zener diodes, resistors, and normal diodes) integrated into the manufacturing process of the metal-oxide-semiconductor field-effect transistor (especially the process after depositing poly-silicon) so as to form the required power element, without needing to add any additional process and thereby reducing the complexity of the manufacturing process.

The method for manufacturing the power element according to the embodiment of the present disclosure has been described above. The specific structure of the power element of the present embodiment will be described below. It should be noted that although the power element of the present embodiment is manufactured by the above-mentioned manufacturing method, the present disclosure is not limited thereto. That is, the power element of the present disclosure may be produced by other methods for manufacturing the power element.

Referring to FIG. 1H, which is to be read in conjunction with FIG. 2 and FIG. 3, an embodiment of the present disclosure also discloses a power element 100, which includes a substrate structure 1, an insulation layer 2, a dielectric layer 8, a metal-oxide-semiconductor field-effect transistor 3 (MOSFET), a zener diode 4 ($V_Z$), a resistor 5 (R), and a normal diode 6 ($V_D$).

The substrate structure 1 includes a base layer 11 and an epitaxial layer 12 formed on the base layer 11. The epitaxial layer 12 concavely forms at least one trench 13. The substrate structure 1 defines a transistor formation region A and a circuit element formation region B adjacent to the transistor formation region A along a length direction D of the substrate structure 1. The trench 13 is located in the transistor formation region A.

The insulation layer 2 is extendingly formed on the epitaxial layer 12 and the inner wall of the trench 13. A portion of the insulation layer 2 located on the inner wall of the trench 13 is defined as a trench insulation layer 21, and the trench insulation layer 21 surrounds a groove 22. The remaining portion of the insulation layer 2 is defined as a cover insulation layer 23. Furthermore, the dielectric layer 8 is formed on the insulation layer 2.

The metal-oxide-semiconductor field-effect transistor 3 is located in the transistor formation region A. The metal-oxide-semiconductor field-effect transistor 3 includes a gate filling structure 31, a matrix doping structure 32, a source metal structure 33, and a drain metal structure 34. The gate filling structure 31 is filled in the groove 22 of the trench insulation layer 21. The matrix doping structure 32 is formed in the epitaxial layer 12 and located in a surrounding area of the trench 13. The source metal structure 33 is formed on the dielectric layer 8 and partially passes through the dielectric layer 8 to be electrically connected to the matrix doping structure 32. The drain metal structure 34 is formed on a bottom surface of the base layer 11.

The zener diode 4 is located in the circuit element formation region B. The zener diode 4 includes a zener diode doping structure 41 and a zener diode metal structure 42. The zener diode doping structure 41 is formed on the cover insulation layer 23 and is covered by the dielectric layer 8. The zener diode doping structure 41 includes a P-type doped region 41P and an N-type doped region 41N that are in contact with each other. The zener diode metal structure 42 is formed on the dielectric layer 8 and partially passes through the dielectric layer 8 to be electrically connected to the P-type doped region 41P and the N-type doped region 41N of the zener diode doping structure 41. The zener diode 4 is configured to receive a reverse bias voltage when the power element 100 is energized.

The resistor 5 is located in the circuit element formation region B and is spaced apart from the zener diode 4. The resistor 5 includes a resistor doping structure 51 and a resistor metal structure 52. The resistor doping structure 51 is formed on the cover insulation layer 23 and is covered by the dielectric layer 8. The resistor doping structure 51 is a P-type doped semiconductor or an N-type doped semiconductor. The resistor metal structure 52 is formed on the dielectric layer 8 and partially passes through the dielectric layer 8 to be electrically connected to the resistor doping structure 51. The resistor 5 is configured to generate a resistance when the power element 100 is energized.

The normal diode 6 is located in the circuit element formation region B and is spaced apart from the zener diode 4. The normal diode 6 includes a normal diode doping structure 61 and a normal diode metal structure 62. The normal diode doping structure 61 is formed on the cover insulation layer 23 and is covered by the dielectric layer 8. The normal diode doping structure 61 includes a P-type doped region 61P and an N-type doped region 61N that are in contact with each other. The normal diode metal structure 62 is formed on the dielectric layer 8 and partially passes through the dielectric layer 8 to be electrically connected to the P-type doped region 61P and the N-type doped region 61N of the normal diode doping structure 61. The normal diode 6 is configured to receive a forward bias voltage when the power element 100 is energized. The normal diode 6 is disposed adjacent to the above-mentioned metal-oxide-semiconductor field-effect transistor 3 (MOSFET).

Second Embodiment

Figure 4:
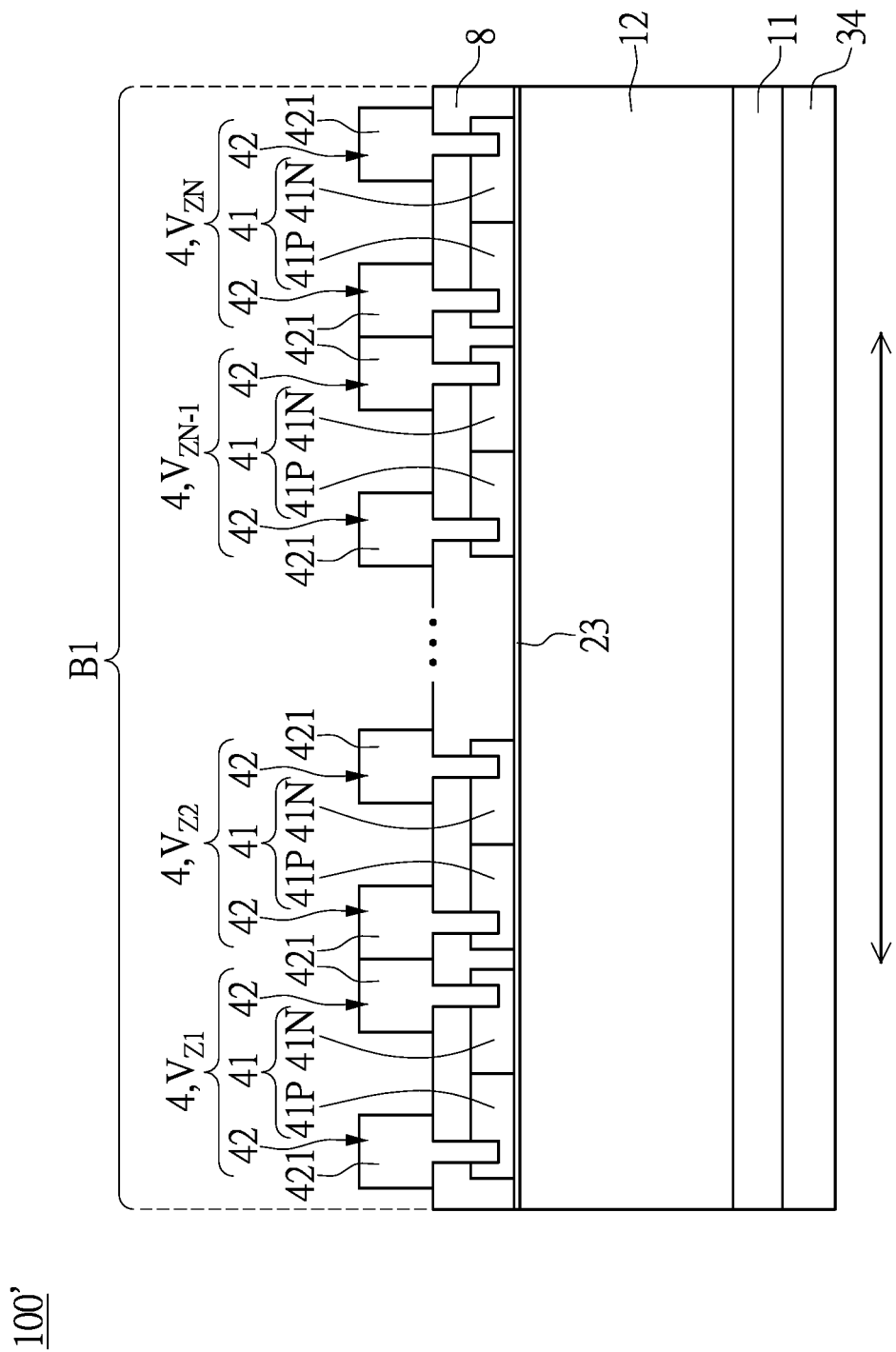
FIG. 4 is a partially enlarged view of a power element according to a second embodiment of the present embodiment.
Figure 5:
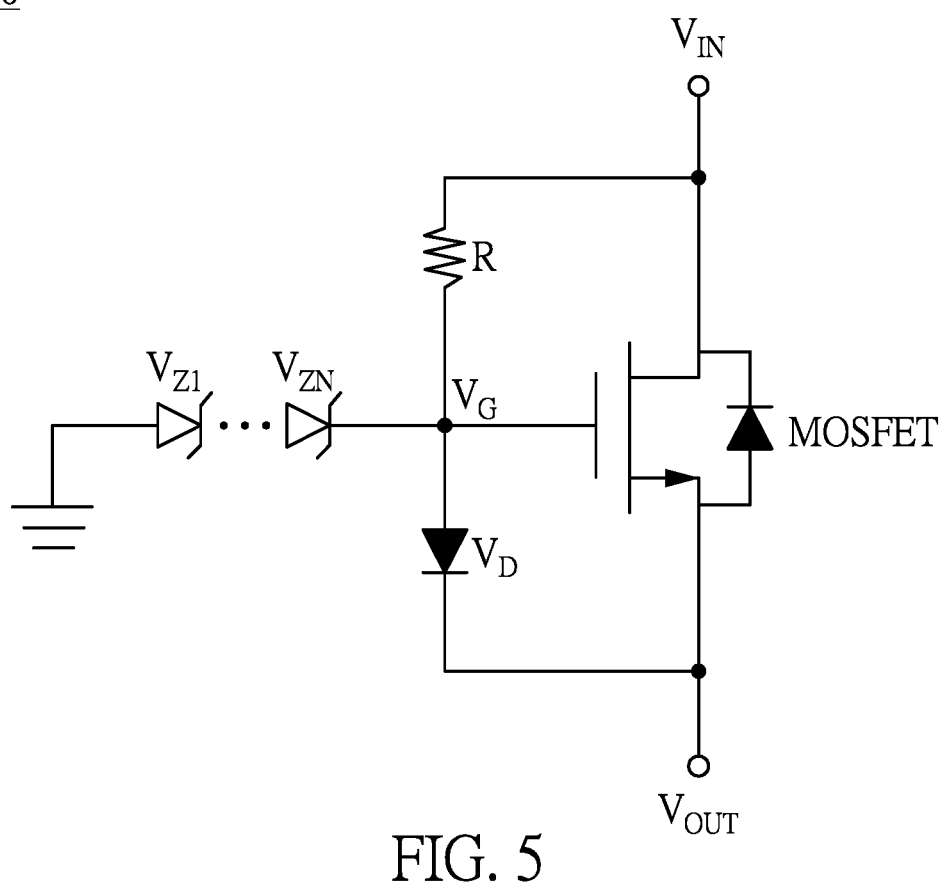
FIG. 5 is an equivalent circuit diagram of the power element according to the second embodiment of the present disclosure.

Referring to FIG. 4 and FIG. 5, a second embodiment of the present disclosure provides a power element 100'. FIG. 4 is a partially enlarged view of the power element according to the second embodiment of the present disclosure. FIG. 5 is an equivalent circuit diagram of the power element according to the second embodiment of the present disclosure.

The structural design of the power element 100' according to the second embodiment of the present disclosure is substantially the same as the above-mentioned first embodiment. The difference is that the power element 100' of the present embodiment includes a plurality of zener diodes 4 ($V_{Z1}$ to $V_{ZN}$) connected in series with each other, which are configured to receive a reverse bias voltage.

As shown in FIG. 4, the plurality of zener diodes 4 ($V_{Z1}$ to $V_{ZN}$) are connected in series with each other and are all disposed on the cover insulation layer 23 of the insulation layer 2. In addition, the plurality of zener diodes 4 ($V_{Z1}$ to $V_{ZN}$) are all located in the zener diode formation region B1 of the circuit element formation region B.

More specifically, the plurality of zener diodes 4 that are connected in series with each other are arranged in a staggered manner of "P-type doped region 41P/N-type doped region 41N, P-type doped region 41P/N-type doped region 41N, and so on". Further, in any two of the zener diodes 4 that are adjacent to and connected in series with each other, the metal pin 421 of one of the zener diodes 4 that is connected to the P-type doped region 41P is directly in contact with and electrically connected to the metal pin 421 of another one of the zener diodes 4 that is connected to the N-type doped region 41N. In addition, the zener diode doping structure 41 of the one of the zener diodes 4 is spaced apart from and not directly in contact with the zener diode doping structure 41 of the another one of the zener diodes 4.

Further, as shown in FIG. 4, in the plurality of zener diodes 4 ($V_{Z1}$ to $V_{ZN}$) connected in series with each other, the metal pin 421 of the first zener diode $V_{Z1}$ (i.e., the leftmost zener diode $V_{Z1}$ as shown in FIG. 4) that is connected to the P-type doped region 41P can be electrically connected to a ground terminal (having a potential of 0 volts) of the power element through a wire (not shown). In addition, the metal pin 421 of the Nth zener diode $V_{ZN}$ (i.e., the rightmost zener diode $V_{ZN}$ as shown in FIG. 4) that is connected to the N-type doped region 41N can be electrically connected to the gate filling structure 31 (i.e., the rightmost gate filling structure as shown in FIG. 2) of the metal-oxide-semiconductor field-effect transistor 3 through another wire (not shown), but the present disclosure is not limited thereto.

As shown in FIG. 5, since the power element 100' of the present embodiment has the plurality of zener diodes 4 ($V_{Z1}$ to $V_{ZN}$) connected in series with each other, a $V_G$ of the power element can be altered by adjusting the number of the zener diodes 4 (e.g., two, three, four, etc.), so that an output voltage $V_{OUT}$ of the power element can be changed, and various power element products with different output voltages can be designed.

Accordingly, the concept of the above structural design can arbitrarily integrate Power MOSFETs of various voltages/currents according to the application requirements of the end products. The output voltage may be $V_{OUT}=V_G-V_D$ and $V_G=(V_{Z1}+V_{Z2}+\ldots V_{ZN})$.

Third Embodiment

Figure 6:
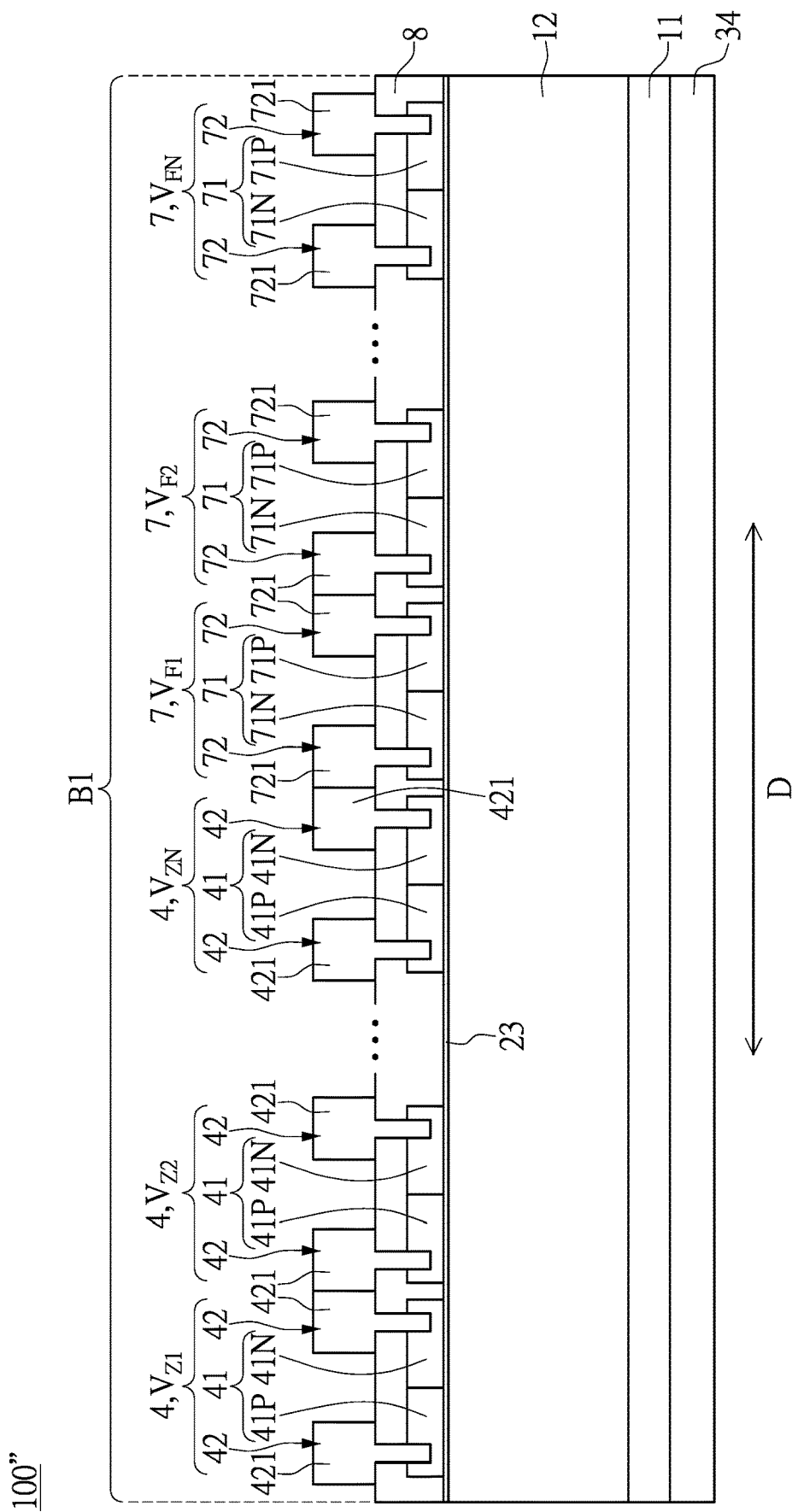
FIG. 6 is a partially enlarged view of a power element according to a third embodiment of the present embodiment.
Figure 7:
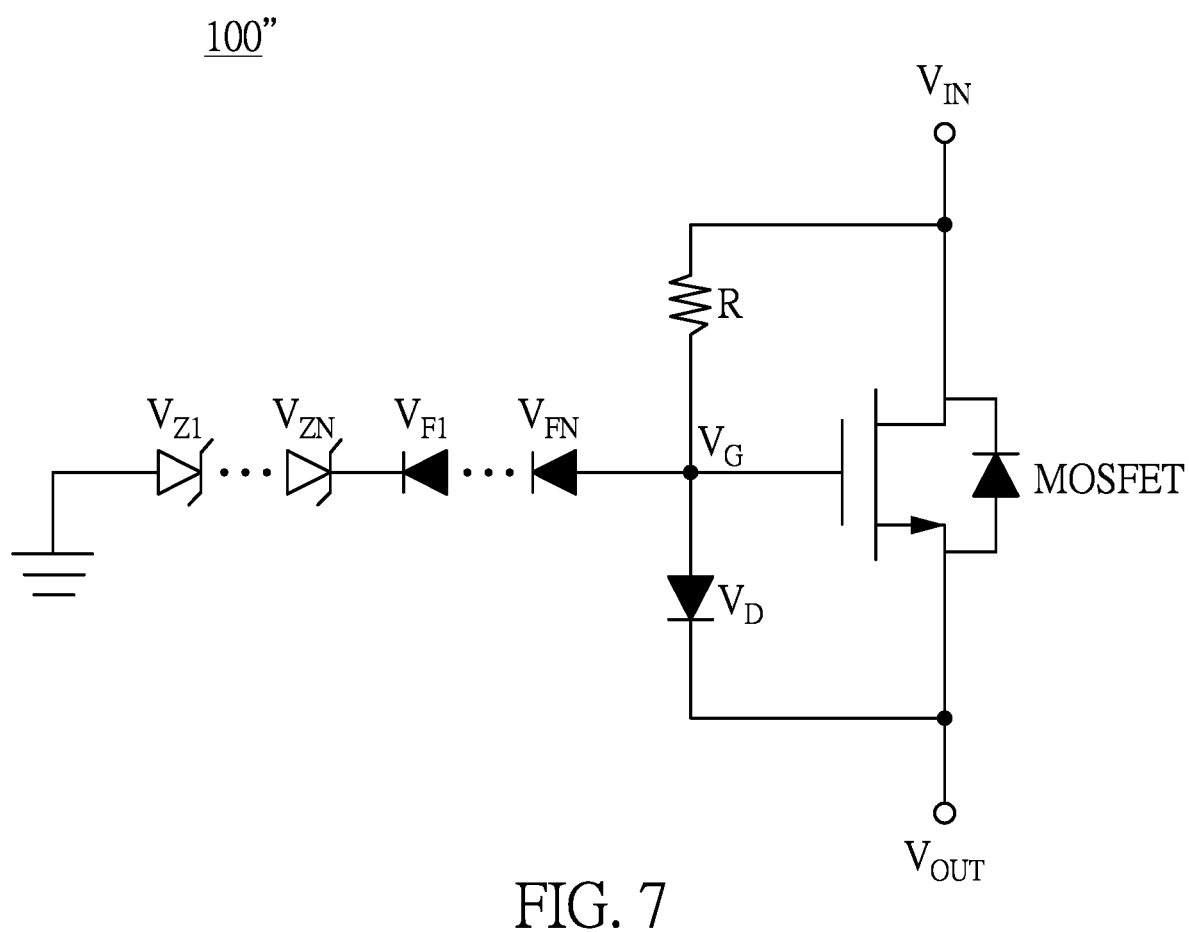
FIG. 7 is an equivalent circuit diagram of the power element according to the third embodiment of the present disclosure.

Referring to FIG. 6 and FIG. 7, a third embodiment of the present disclosure provides a power element 100″. FIG. 6 is a partially enlarged view of the power element according to the third embodiment of the present disclosure. FIG. 7 is an equivalent circuit diagram of the power element according to the third embodiment of the present disclosure.

The structural design of the power element 100″ according to the third embodiment of the present disclosure is substantially the same as the above-mentioned first embodiment. The difference is that the power element 100″ of the present embodiment includes a plurality of ordinary diodes 7 ($V_{F1}$ to $V_{FN}$) connected in series with each other. The plurality of ordinary diodes 7 ($V_{F1}$ to $V_{FN}$) are further connected in series to the plurality of zener diodes 4 ($V_{Z1}$ to $V_{ZN}$).

In the present embodiment, the plurality of ordinary diodes 7 ($V_{F1}$ to $V_{FN}$) are disposed in series with each other and are all disposed on the cover insulation layer 23 of the insulation layer 2. Further, the plurality of ordinary diodes 7 ($V_H$ to $V_{FN}$) are connected in series to the plurality of zener diodes 4 ($V_{Z1}$ to $V_{ZN}$).

More specifically, each of the ordinary diodes 7 includes an ordinary diode doping structure 71 and an ordinary diode metal structure 72. Each of the ordinary diode doping structures 71 is formed on the cover insulation layer 23 of the insulation layer 2 and is covered by the dielectric layer 8. Each of the ordinary diode doping structures 71 includes a P-type doped region 71P and an N-type doped region 71N that are in contact with each other. Each of the ordinary diode metal structures 7 includes two metal pins 721. In each of the ordinary diodes 7, the two metal pins 721 of the ordinary diode metal structure 72 are respectively formed on the dielectric layer 8 and partially pass through the dielectric layer 8 to be respectively and electrically connected to the P-type doped region 71P and the N-type doped region 71N of the ordinary diode doping structure 71. Each of the ordinary diodes 7 is configured to receive a forward bias voltage.

That is, in each of the ordinary diodes 7, a potential of the metal pin 721 connected to the P-type doped region 71P is "higher" than a potential of the metal pin 721 connected to the N-type doped region 71N, thereby generating a "forward bias voltage" when the power element 100″ is energized. Furthermore, a series connection of the plurality of ordinary diodes 7 ($V_{F1}$ to $V_{FN}$) is similar to that of the plurality of zener diodes 4 of the second embodiment as described above, and will not be reiterated herein.

Accordingly, when the power element 100″ is energized, the plurality of ordinary diodes 7 ($V_{F1}$ to $V_{FN}$) are configured to receive a forward bias voltage, and the plurality of zener diodes 4 ($V_{Z1}$ to $V_{ZN}$) that are connected in series to the plurality of ordinary diodes 7 ($V_{F1}$ to $V_{FN}$) are configured to receive a reverse bias voltage.

Referring to FIG. 6 again, the plurality of ordinary diodes 7 that are connected in series with each other are arranged in a staggered manner of "N-type doped region 71N/P-type doped region 71N, N-type doped region 71N/P-type doped region 71P, and so on". In the plurality of zener diodes 4 ($V_{Z1}$ to $V_{ZN}$) and the plurality of ordinary diodes 7 ($V_{F1}$ to $V_{FN}$), the metal pin 421 of the Nth zener diode $V_{ZN}$ (i.e., the rightmost zener diode $V_{ZN}$ as shown in FIG. 6) that is connected to the N-type doped region 41N is directly in contact with and electrically connected to the metal pin 721 of the first ordinary diode $V_{F1}$ (i.e., the leftmost ordinary diode $V_{F1}$ as shown in FIG. 6) that is connected to the N-type doped region 71N.

In addition, the metal pin 421 of the first zener diode $V_{Z1}$ (i.e., the leftmost zener diode $V_{Z1}$ as shown in FIG. 6) that is connected to the P-type doped region 41P can be electrically connected to a ground terminal (having a potential of 0 volts) of the power element through a wire (not shown). The metal pin 721 of the Nth ordinary diode $V_{FN}$ (i.e., the rightmost ordinary diode $V_{FN}$ as shown in FIG. 6) that is connected to the P-type doped region 71P can be electrically connected to the gate filling structure 31 (i.e., the rightmost gate filling structure as shown in FIG. 2) of the metal-oxide-semiconductor field-effect transistor 3 through another wire (not shown), but the present disclosure is not limited thereto.

As shown in FIG. 7, since the power element 100″ of the present embodiment has the plurality of zener diodes 4 ($V_{Z1}$ to $V_{ZN}$) and the plurality of ordinary diodes 7 ($V_{F1}$ to $V_{FN}$) connected in series with each other, the $V_G$ of the power element can be altered by adjusting the number of zener diodes 4 and the number of ordinary diodes 7, so that the output voltage $V_{OUT}$ of the power element can be changed, and the various power element products with different output voltages can be designed. The structural design described above enables the design range of the output voltage to be broader and more variable. The output voltage may be $V_{OUT}=V_G-V_D$ and $V_G=(V_{Z1}+V_{Z2}+\ldots V_{ZN})+(V_{F1}+V_{F2}+\ldots V_{FN})$.

It should be noted that although an order of series connection of the plurality of electronic components in the present embodiment is described by taking $V_{Z1}$ to $V_{ZN}$ and $V_{F1}$ to $V_{FN}$ as examples, the present disclosure is not limited thereto. For example, in other embodiments of the present disclosure, the order of series connection of the plurality of electronic components may be, for example, $V_{F1}$ to $V_{FN}$ and $V_{Z1}$ to $V_{ZN}$; or, for example, $V_{Z1}$, $V_{F1}$, $V_{Z2}$, $V_{F2}$, ..., $V_{ZN}$, $V_{FN}$, which is arranged in a staggered manner. The order of series connection of the plurality electronic components does not affect the final $V_G$ (i.e., the sum of the voltages that all electronic components can withstand).

Fourth Embodiment

Figure 8:
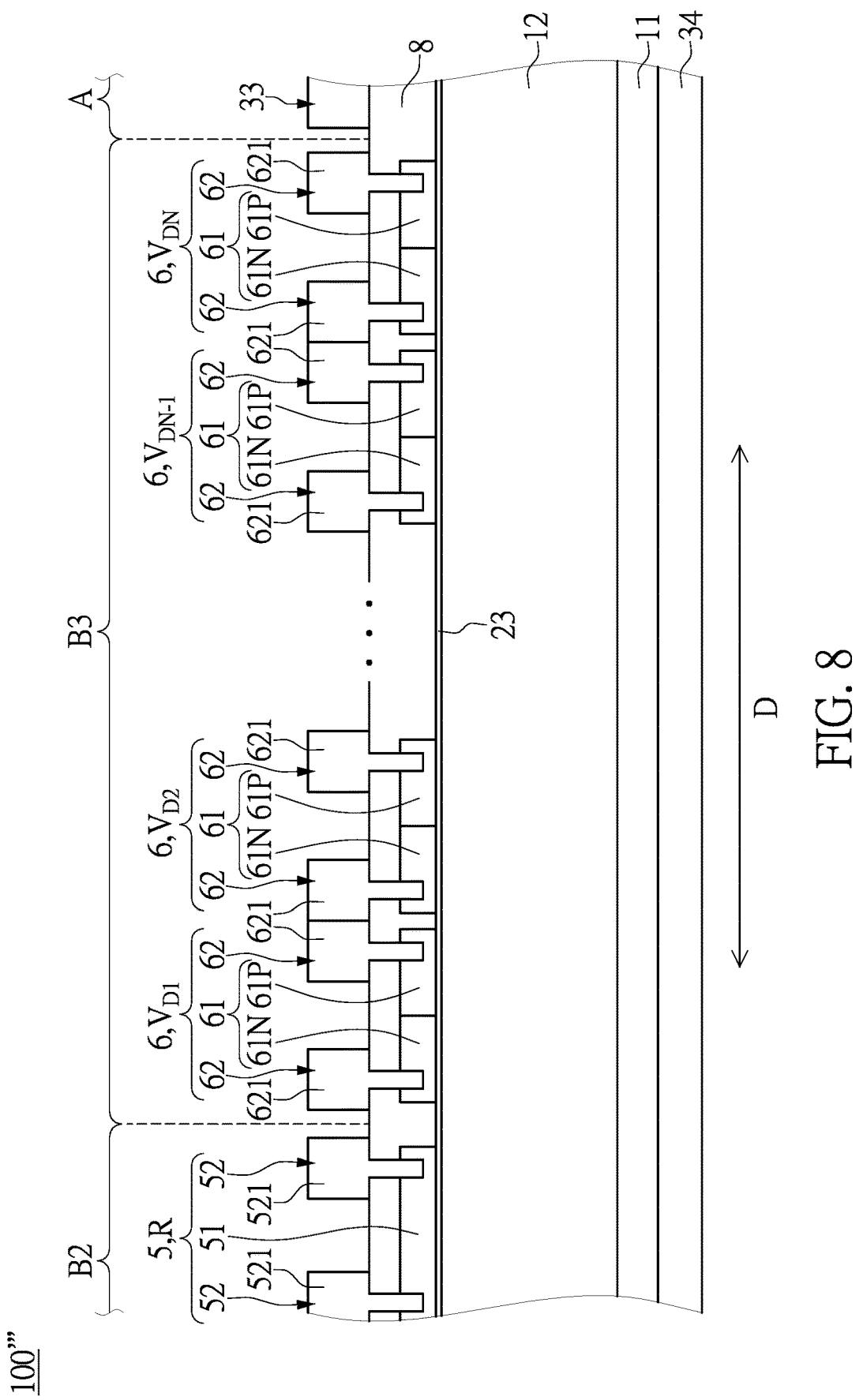
FIG. 8 is a partially enlarged view of a power element according to a fourth embodiment of the present embodiment.
Figure 9:
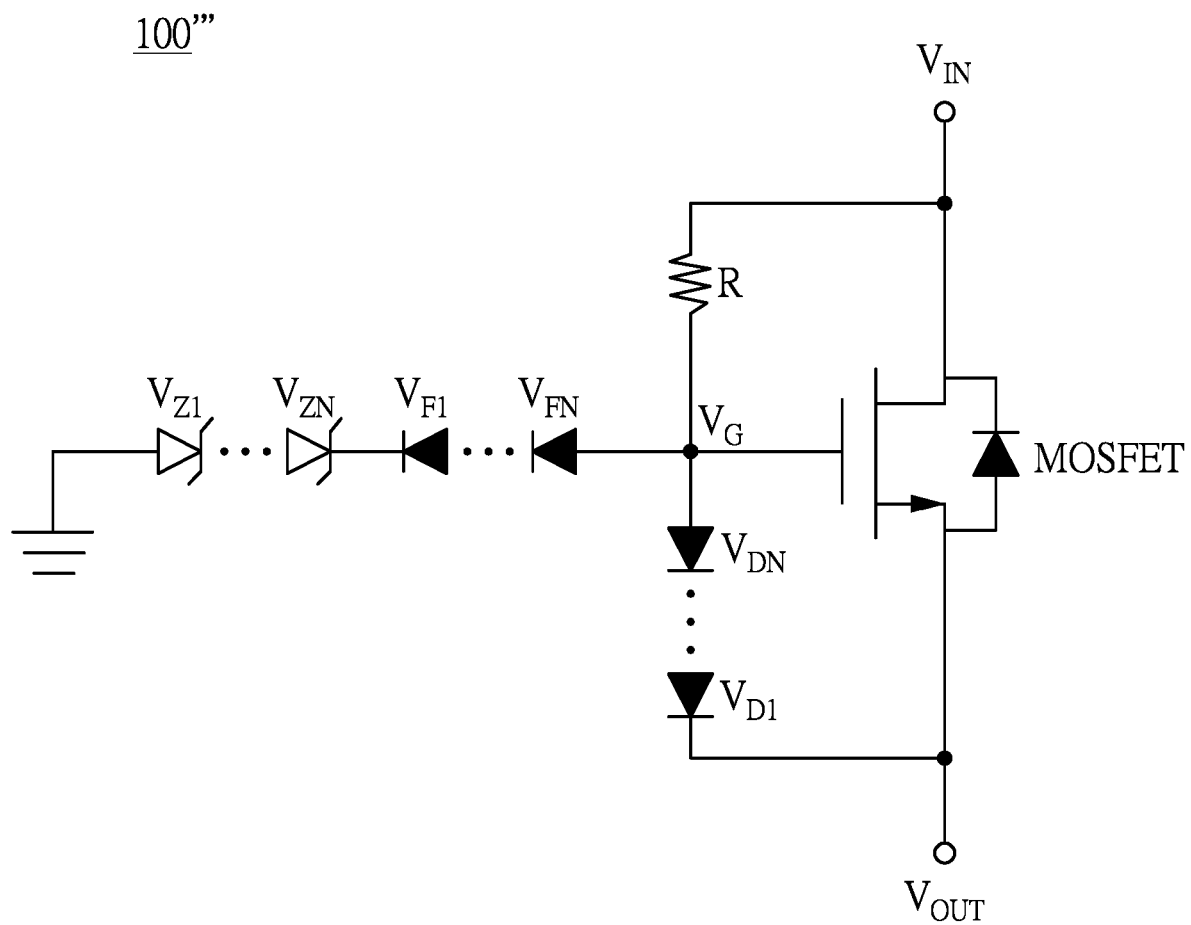
FIG. 9 is an equivalent circuit diagram of the power element according to the fourth embodiment of the present disclosure.

Referring to FIG. 8 and FIG. 9, a fourth embodiment of the present disclosure provides a power element 100′″. FIG. 8 is a partially enlarged view of the power element according to the fourth embodiment of the present disclosure. FIG. 9 is an equivalent circuit diagram of the power element according to the fourth embodiment of the present disclosure.

The structural design of the power element 100′″ according to the fourth embodiment of the present disclosure is substantially the same as the above-mentioned third embodiment. The difference is that the power element 100′″ of the present embodiment further has a plurality of normal diodes 6 ($V_{D1}$ to $V_{DN}$) connected in series with each other, which are configured to receive a forward bias voltage.

As shown in FIG. 8, the plurality of normal diodes 6 ($V_{D1}$ to $V_{DN}$) are disposed in series with each other and are all disposed on the cover insulation layer 23 of the insulation layer 2. The plurality of normal diodes 6 ($V_{D1}$ to $V_{DN}$) are located in the normal diode formation region B3 of the circuit element formation region B.

Furthermore, the plurality of normal diodes 6 that are connected in series with each other are spaced apart from the resistor 5, and are also spaced apart from the plurality of zener diodes 4 ($V_{Z1}$ to $V_{ZN}$) and the plurality of ordinary diodes 7 ($V_{F1}$ to $V_{FN}$).

More specifically, the plurality of normal diodes 6 that are connected in series with each other are arranged in a staggered manner of "N-type doped region 61N/P-type doped region 61P, N-type doped region 61N/P-type doped region 61P, and so on". Further, in any two of the normal diodes 6 that are adjacent to and connected in series with each other, the metal pin 621 of one of the normal diodes 6 that is connected to the P-type doped region 61P is directly in contact with and electrically connected to the metal pin 621 of another one of the normal diodes 6 that is connected to the N-type doped region 61N. In addition, the normal diode doping structure 61 of the one of the normal diodes 6 does not directly contact the normal diode doping structure 61 of the another one of the normal diodes 6.

Further, as shown in FIG. 8, in the plurality of normal diodes 6 connected in series with each other, the metal pin 621 of the Nth normal diode $V_{DN}$ (i.e., the rightmost normal diode $V_{DN}$ as shown in FIG. 8) that is connected to the P-type doped region 61P can be electrically connected to one of the gate filling structures 31 of the metal-oxide-semiconductor field-effect transistor 3 (i.e., the rightmost gate filling structure as shown in FIG. 2) through a wire (not shown). In addition, the metal pin 621 of the first normal diode $V_{D1}$ (i.e., the leftmost normal diode $V_{D1}$ as shown in FIG. 8) that is connected to the N-type doped region 61N can be electrically connected to the source metal structure 33 of the metal-oxide-semiconductor field-effect transistor 3 through another wire (not shown), but the present disclosure is not limited thereto. That is, the plurality of normal diodes 6 ($V_{D1}$ to $V_{DN}$) are connected in series between the gate (G) and source (S) of the metal-oxide-semiconductor field-effect transistor 3 (MOSFET).

As shown in FIG. 9, the power element 100''' of the present embodiment not only has the plurality of zener diodes 4 ($V_{Z1}$ to $V_{ZN}$) and the plurality of ordinary diodes 7 ($V_{F1}$ to $V_{FN}$) connected in series with each other, but also has the plurality of normal diodes 6 ($V_{D1}$ to $V_{DN}$) connected in series with each other. Therefore, the structural design described above enables the design range of the output voltage to be broader and more variable. The output voltage may be: $V_{OUT}=V_G-V_D$, in which $V_G=(V_{Z1}+V_{Z2}+\ldots V_{ZN})+(V_{F1}+V_{F2}+\ldots V_{FN})$, and $V_D=(V_{D1}+V_{D2}+\ldots V_{DN})$.

Fifth Embodiment

Figure 10:
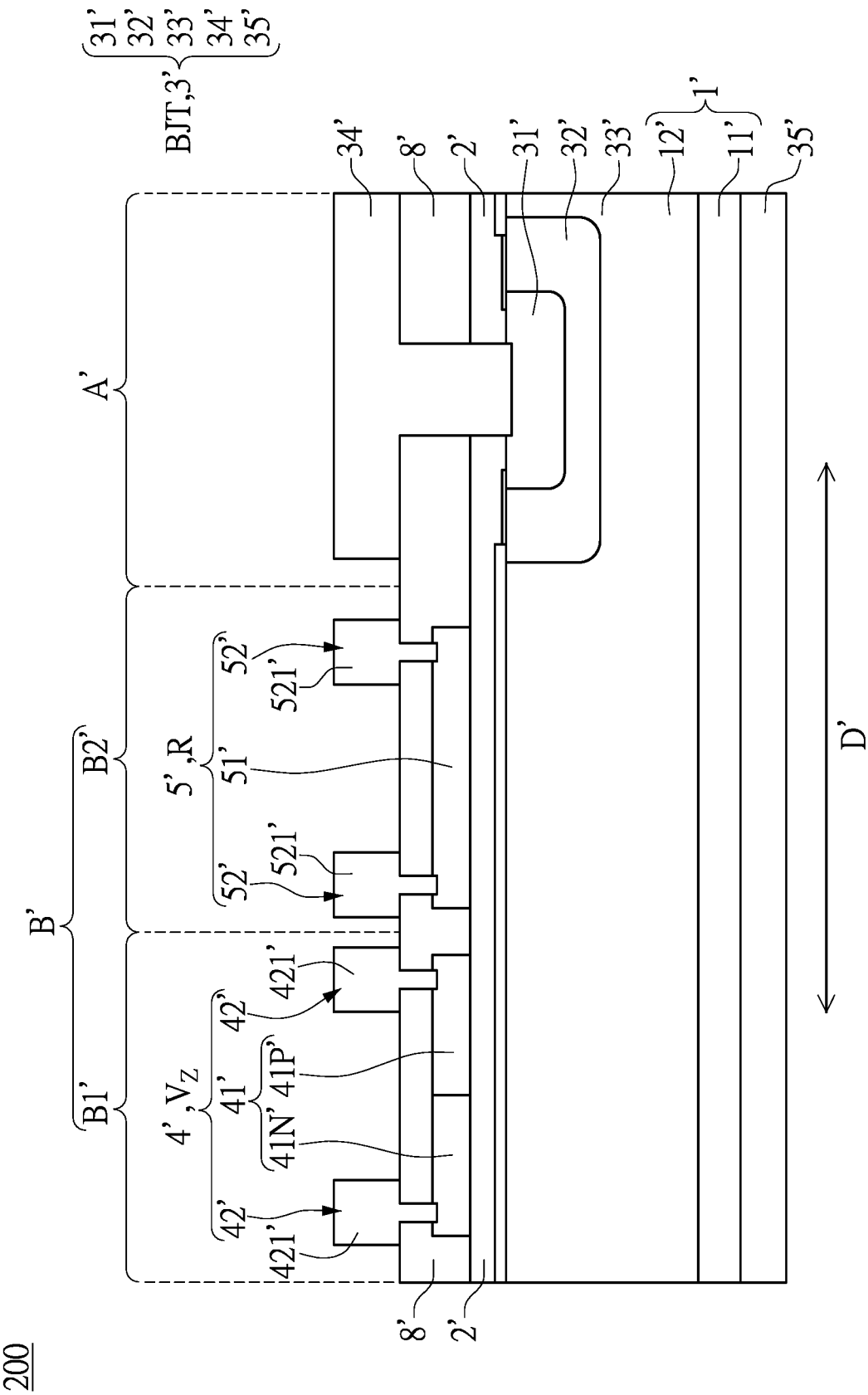
FIG. 10 is a cross-sectional view showing a power element according to a fifth embodiment of the present disclosure.
Figure 11:
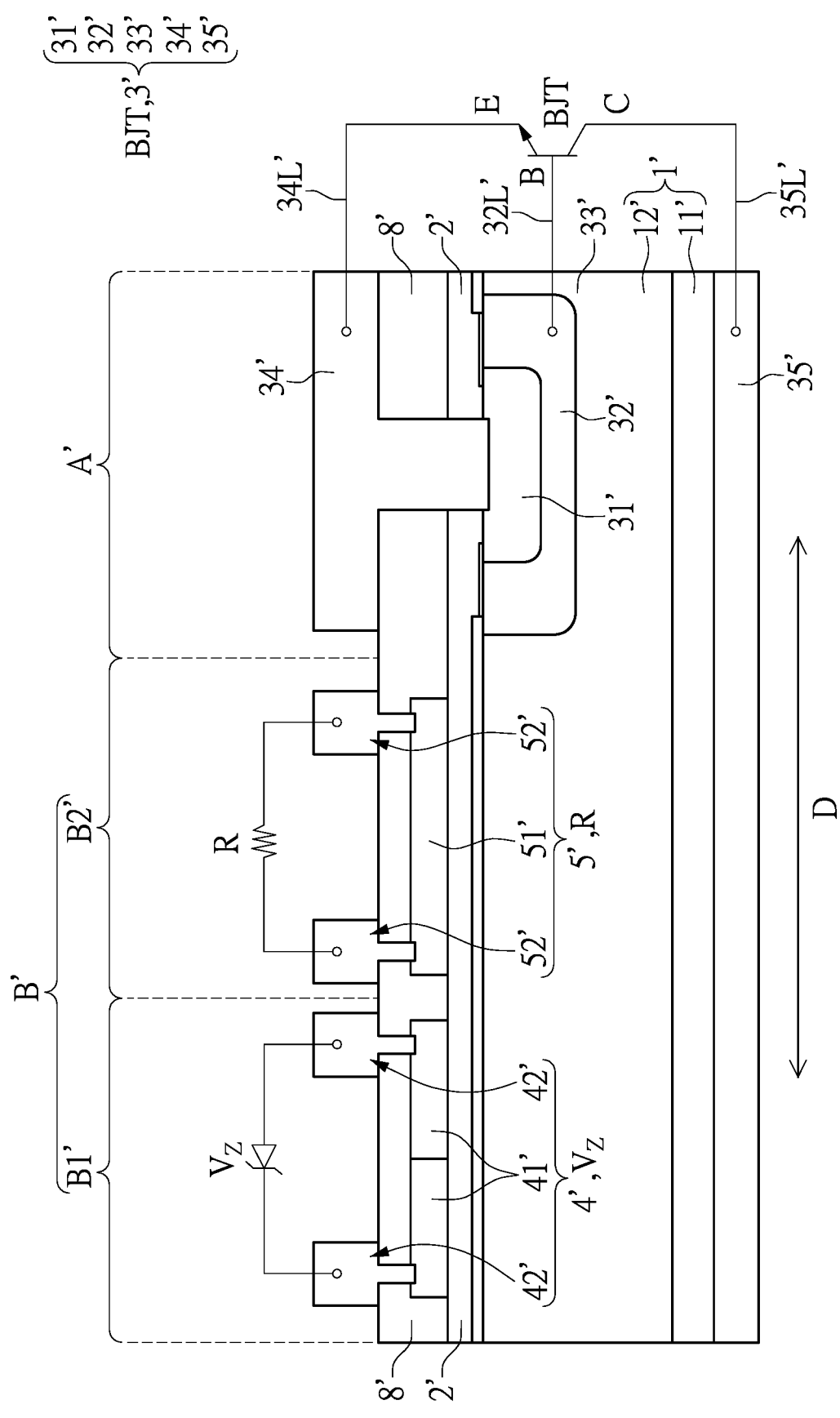
FIG. 11 is a cross-sectional view showing the power element according to the fifth embodiment of the present disclosure, which also illustrates an equivalent circuit corresponding to the components of the power element.
Figure 12:
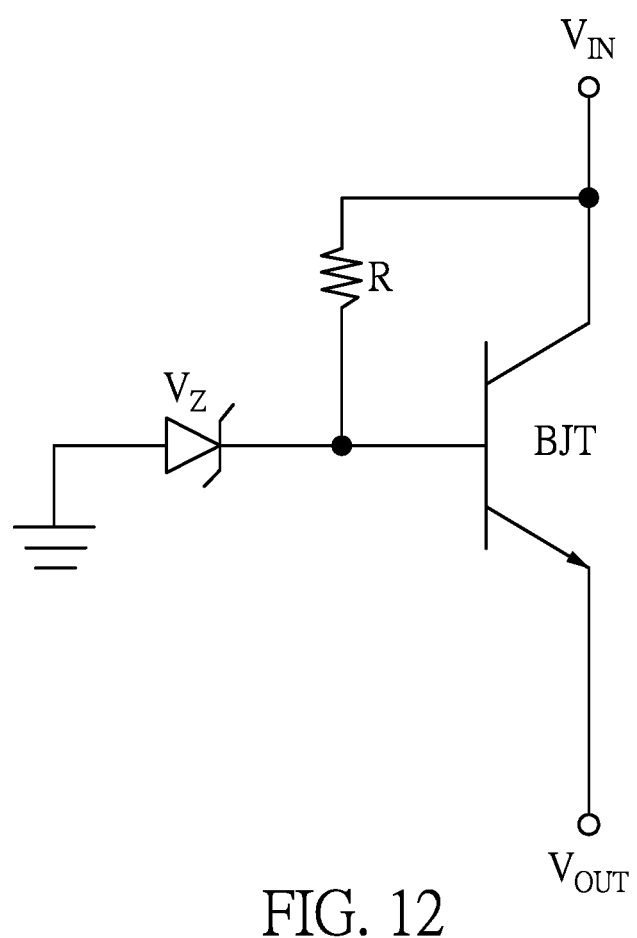
FIG. 12 is an equivalent circuit diagram of the power element according to the fifth embodiment of the present disclosure.

Referring to FIG. 10 to FIG. 12, a fifth embodiment of the present disclosure provides a power element 200. FIG. 10 is a cross-sectional view showing the power element according to the fifth embodiment of the present disclosure. FIG. 11 is a cross-sectional view showing the power element according to the fifth embodiment of the present disclosure, which also illustrates an equivalent circuit corresponding to the components of the power element. FIG. 12 is an equivalent circuit diagram of the power element according to the fifth embodiment of the present disclosure.

The power element 200 of the present embodiment is a power element based on a bipolar junction transistor (BJT). That is, the power element 200 of the present embodiment is a power element improved by using the bipolar junction transistor as the basic structure. Furthermore, the power element 200 of the present embodiment may be applied to a high voltage regulator, but the present disclosure is not limited thereto.

The power element 200 includes a substrate structure 1', an insulation layer 2', a dielectric layer 8', a bipolar junction transistor 3'(BJT), an zener diode 4'($V_Z$), and a resistor 5'(R).

It is worth mentioning that since the bipolar junction transistor 3'(BJT) has a built-in diode, the power element 200 of the present embodiment preferably does not include an additional normal diode. However, the present disclosure is not limited thereto.

The substrate structure 1' includes a base layer 11' (e.g., $N^+$ substrate) and an epitaxial layer 12' (e.g., $N^-$ EPI) formed on the base layer 11'. The substrate structure 1' defines a transistor formation region A' and a circuit element formation region B' adjacent to the transistor formation region A' along a length direction D of the substrate structure 1', in which the circuit element formation region B' can be further divided into a zener diode formation region B1' and a resistor formation region B2'.

Further, the insulation layer 2' is formed on the epitaxial layer 12', and the dielectric layer 8' is formed on the insulation layer 2'.

In addition, the bipolar junction transistor 3' is located in the transistor formation region A'. The bipolar junction transistor 3' includes an emitter doping structure 31', a base doping structure 32', a collector doping structure 33', an emitter metal structure 34', and a collector metal structure 35'.

The emitter doping structure 31' and the base doping structure 32' are both formed in the epitaxial layer 12' and are both located in the upper half portion of the epitaxial layer 12'. The inner side of the base doping structure 32' surrounds the emitter doping structure 31'. The outer side of the base doping structure 32' is in contact with the epitaxial layer 12'. Both the upper surface of the emitter doping structure 31' and the upper surface of the base doping structure 32' are aligned with the upper surface of the epitaxial layer 12' and are covered by the insulation layer 2'. The remaining portion of the epitaxial layer 12' (i.e., a portion not covered by the emitter doping structure 31' and the base doping structure 32') is defined as the collector doping structure 33'.

In the present embodiment, the emitter doping structure 31', the base doping structure 32' and the collector doping structure 33' are sequentially an N-type doped semiconductor, a P-type doped semiconductor and an N-type doped semiconductor so that an NPN-type transistor is formed, but the present disclosure is not limited thereto. For example, the emitter doping structure 31', the base doping structure 32' and the collector doping structure 33' may be sequentially a P-type doped semiconductor, an N-type doped semiconductor and a P-type doped semiconductor so that a PNP-type transistor is formed.

The emitter metal structure 34' is formed on the dielectric layer 8' and partially passes through the dielectric layer 8' and the insulation layer 2' to be electrically connected to the emitter doping structure 31'. The collector metal structure 35' is formed on a bottom surface of the base layer 11'.

According to the above configuration, as shown in FIG. 10 and FIG. 11, the base doping structure 32' can be used to electrically connect a base wire 32L' (or a base pin) to define a base B of the bipolar junction transistor. The emitter metal structure 34' can be used to electrically connect an emitter wire 34L' (or an emitter pin) to define an emitter E of the bipolar junction transistor. The collector metal structure 35' can be used to electrically connect a collector wire 35L' (or a collector pin) to define a collector C of the bipolar junction transistor. The above-mentioned components (e.g., the emitter doping structure 31', the base doping structure 32', the collector doping structure 33', and etc.) located in the transistor formation region A' can together form the bipolar junction transistor 3', and the equivalent circuit diagram is shown in FIG. 12.

The zener diode 4'($V_Z$) is located in the zener diode formation region B1' of the circuit element formation region B'. The zener diode 4' includes a zener diode doping structure 41' and a zener diode metal structure 42'. The zener diode doping structure 41' is formed on the insulation layer 2' and is covered by the dielectric layer 8'. The zener diode doping structure 41' includes a P-type doped region 41P' and an N-type doped region 41N' that are in contact with each other. The zener diode metal structure 42' includes two metal pins 421' separated from each other. The two metal pins 421' of the zener diode metal structure 42' are both formed on the dielectric layer 8' and partially pass through the dielectric layer 8' to be respectively and electrically connected to the P-type doped region 41P' and the N-type doped region 41N' of the zener diode doping structure 41'. The zener diode 4' is configured to receive a reverse bias voltage when the power element 200 is energized.

The resistor 5'(R) is located in the resistor formation region B2' of the circuit element formation region B' and is spaced apart from the zener diode 4'. The resistor 5' includes a resistor doping structure 51' and a resistor metal structure 52'. The resistor doping structure 51' is formed on the insulation layer 2' and is covered by the dielectric layer 8'. The resistor doping structure 51' is a P-type doped semiconductor or an N-type doped semiconductor. The resistor metal structure 52' includes two metal pins 521' separated from each other. The two metal pins 521' of the resistor metal structure 52' are both formed on the dielectric layer 8' and partially pass through the dielectric layer 8' to be electrically connected to the resistor doping structure 51'. The resistor 5' is configured to generate a resistance when the power element 200 is energized.

Sixth Embodiment

Figure 13:
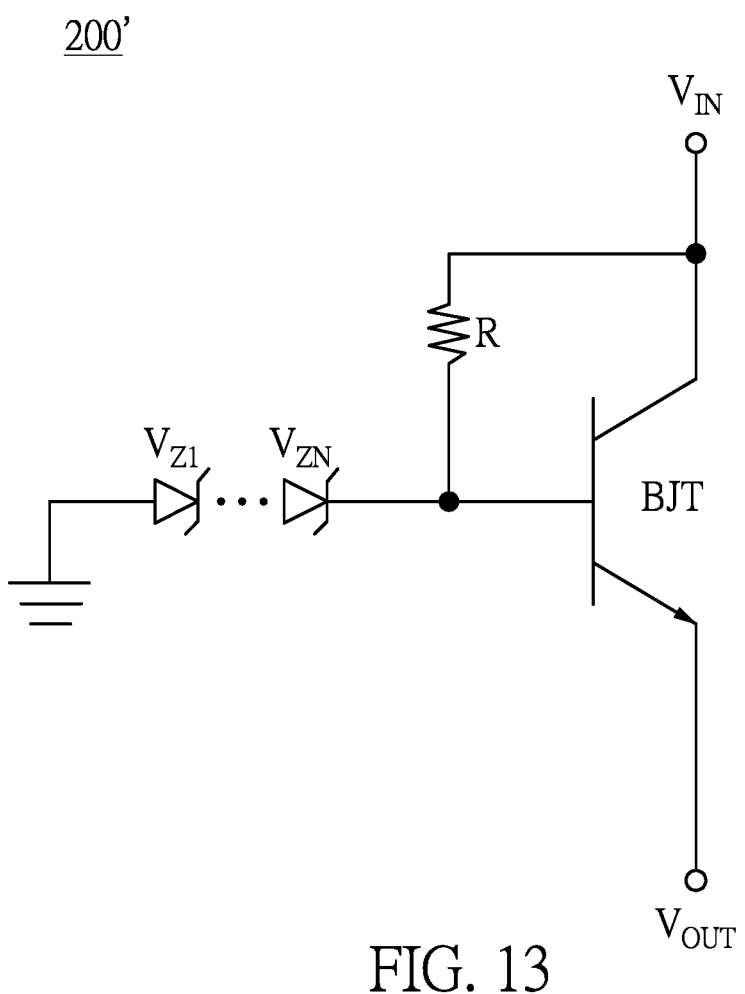
FIG. 13 is an equivalent circuit diagram of a power element according to a sixth embodiment of the present disclosure.

Referring to FIG. 13, a sixth embodiment of the present disclosure also provides a power element 200'. The structural design of the power element 200' according to the sixth embodiment of the present disclosure is substantially the same as the above-mentioned fifth embodiment. The difference is that the power element 200' of the present embodiment includes a plurality of zener diodes 4' ($V_{Z1}$ to $V_{ZN}$) connected in series with each other, which are configured to receive a reverse bias voltage. The series connection of the plurality of zener diodes 4'($V_Z$) is similar to FIG. 4, and will not be reiterated herein. FIG. 13 is an equivalent circuit diagram of the power element according to the sixth embodiment of the present disclosure.

Seventh Embodiment

Figure 14:
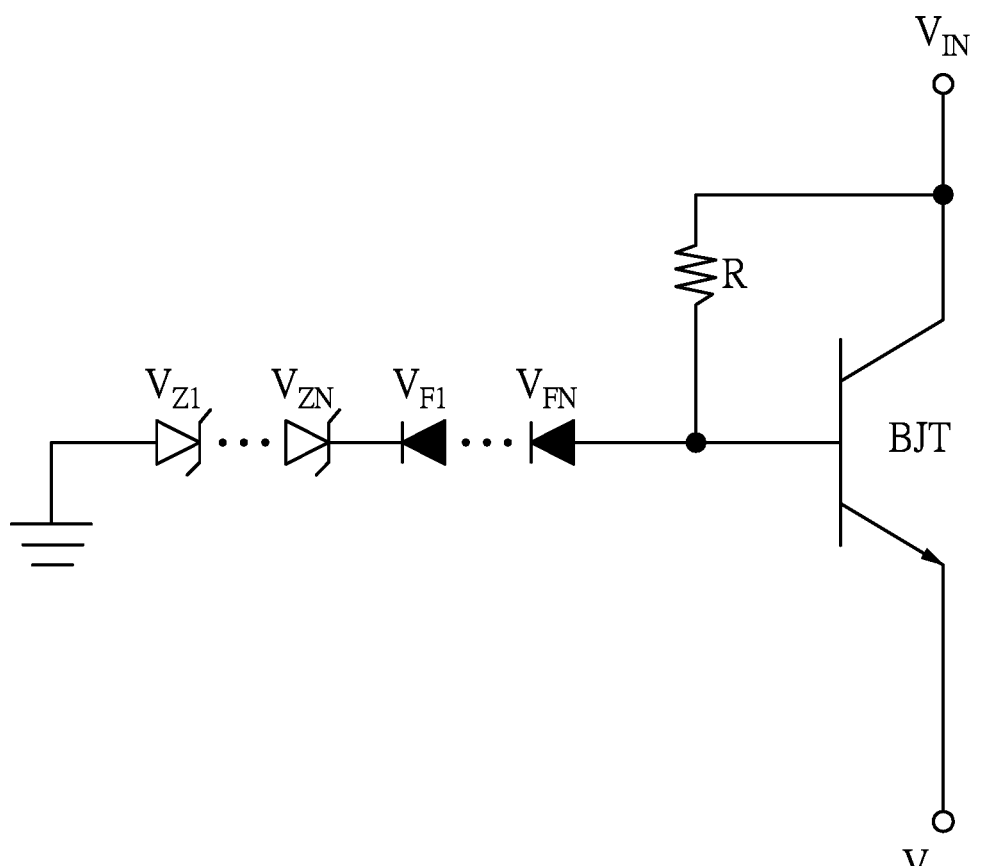
FIG. 14 is an equivalent circuit diagram of a power element according to a seventh embodiment of the present disclosure.

Referring to FIG. 14, a seventh embodiment of the present disclosure also provides a power element 200". The structural design of the power element 200" according to the seventh embodiment of the present disclosure is substantially the same as the above-mentioned sixth embodiment. The difference is that the power element 200" of the present embodiment further includes a plurality of ordinary diodes ($V_{F1}$ to $V_{FN}$) connected in series with each other. The plurality of ordinary diodes ($V_{F1}$ to $V_{FN}$) are further connected in series to the plurality of zener diodes 4' ($V_{Z1}$ to $V_{ZN}$). The series connections of the plurality of ordinary diodes ($V_{F1}$ to $V_{FN}$) and the zener diodes 4'($V_Z$) are similar to FIG. 6, and will not be reiterated herein. FIG. 14 is an equivalent circuit diagram of the power element according to the seventh embodiment of the present disclosure. It should be noted that although the series order of the plurality of electronic components in the present embodiment is described by taking $V_{Z1}$ to $V_{ZN}$ and $V_{F1}$ to $V_{FN}$ as examples, the present disclosure is not limited thereto. For example, in other embodiments of the present disclosure, the series order of the plurality of electronic components may be, for example, $V_{F1}$ to $V_{FN}$ and $V_{Z1}$ to $V_{ZN}$; or, for example, an arbitrarily staggered series order of $V_{Z1}$, $V_{F1}$, $V_{Z2}$, $V_{F2}$, $V_{ZN}$, $V_{FN}$. The serial order of the plurality electronic components does not affect the final $V_G$ (i.e., the sum of the voltages that all electronic components can withstand).

BENEFICIAL EFFECTS

In conclusion, in the power element of the present disclosure, the transistor and different electronic elements (e.g., zeners diodes, resistors, and normal diodes) are embedded into a single power element, so that the complexity of the manufacturing process is reduced, and the size of the end product is also reduced.

Further, since the power element of the present disclosure may be designed to have the plurality of zener diodes (and ordinary diodes and/or normal diodes) connected in series with each other, the output voltage $V_{OUT}$ of the power element can be changed by adjusting the number of zener diodes (and the ordinary diodes and/or the normal diodes) to design the various power element products with different output voltages. The structural design described above enables the design range of the output voltage to be broader and more variable. That is, the output voltage $V_{OUT}$ of the power element of the present disclosure is positively correlated with the number of zener diodes, ordinary diodes, and normal diodes.

In addition, the structural design of the power element of the present disclosure can reduce the number of electronic components required to be placed on the system circuit board since part of the electronic components are integrated into the integrated component manufacturing process of the present disclosure. Therefore, the size of the end product can be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power element, comprising:
a substrate structure including a base layer and an epitaxial layer formed on the base layer; wherein the substrate structure defines a transistor formation region and a circuit element formation region adjacent to the transistor formation region along a length direction of the substrate structure;
an insulation layer being formed on the epitaxial layer;
a dielectric layer being formed on the insulation layer;

a transistor being located in the transistor formation region; wherein the transistor is formed on the substrate structure and partially formed in the substrate structure, the insulation layer, and the dielectric layer; and a plurality of zener diodes being located in the circuit element formation region and connected in series with each other; wherein each of the zener diodes includes:
a zener diode doping structure being formed on the insulation layer and is covered by the dielectric layer; wherein the zener diode doping structure includes a P-type doped region and an N-type doped region that are in contact with each other; and
a zener diode metal structure being formed on the dielectric layer and partially passing through the dielectric layer to be electrically connected to the P-type doped region and the N-type doped region of the zener diode doping structure;

wherein each of the zener diodes is configured to receive a reverse bias voltage when the power element is energized;

wherein in each of the zener diodes, the zener diode metal structure includes two metal pins, the two metal pins are spaced apart from each other, and both the two metal pins partially pass through the dielectric layer to be respectively and electrically connected to the N-type doped region and the P-type doped region of the zener diode doping structure;

wherein, when the power element is energized, a potential of the metal pin connected to the P-type doped region is lower than a potential of the metal pin connected to the N-type doped region, so that the reverse bias voltage is generated.

2. The power element according to claim 1, wherein the transistor is a metal-oxide-semiconductor field-effect transistor (MOSFET), the epitaxial layer concavely forms at least one trench, the at least one trench is located in the transistor formation region, the insulation layer is extendingly formed on the epitaxial layer and an inner wall of the at least one trench, a portion of the insulation layer located on the inner wall of the at least one trench is defined as a trench insulation layer which surrounds a groove, and the remaining portion of the insulation layer located on the epitaxial layer is defined as a cover insulation layer; wherein the metal-oxide-semiconductor field-effect transistor includes:
a gate filling structure being formed in the groove of the trench insulation layer;
a matrix doping structure being formed in the epitaxial layer and located in a surrounding area of the trench;
a source metal structure being formed on the dielectric layer and partially passing through the dielectric layer to be electrically connected to the matrix doping structure; and
a drain metal structure being formed on a bottom surface of the base layer.

3. The power element according to claim 1, wherein the transistor is a bipolar junction transistor (BJT) which includes an emitter doping structure, a base doping structure, a collector doping structure, an emitter metal structure, and a collector metal structure; wherein the emitter doping structure and the base doping structure are both formed in the epitaxial layer, an inner side of the base doping structure surrounds the emitter doping structure, an outer side of the base doping structure is in contact with the epitaxial layer, both an upper surface of the emitter doping structure and an upper surface of the base doping structure are aligned with an upper surface of the epitaxial layer and are covered by the insulation layer, the remaining portion of the epitaxial layer not covered by the emitter doping structure and the base doping structure is defined as the collector doping structure, the emitter metal structure is formed on the dielectric layer and partially passes through the dielectric layer and the insulation layer to be electrically connected to the emitter doping structure, and the collector metal structure is formed on a bottom surface of the base layer.

4. The power element according to claim 1, wherein the plurality of zener diodes are connected in series with each other and are all disposed on the insulation layer, wherein in any two of the zener diodes that are adjacent to and connected in series with each other, the metal pin of one of the zener diodes that is connected to the P-type doped region is directly in contact with and electrically connected to the metal pin of another one of the zener diodes that is connected to the N-type doped region, and wherein the zener diode doping structure of the one of the zener diodes is spaced apart from and not directly in contact with the zener diode doping structure of the another one of the zener diodes.

5. The power element according to claim 4, further comprising: a plurality of ordinary diodes; wherein the plurality of ordinary diodes are disposed in series with each other on the insulation layer, and the plurality of ordinary diodes are connected in series to the plurality of zener diodes.

6. The power element according to claim 5, wherein each of the ordinary diodes includes an ordinary diode doping structure and an ordinary diode metal structure, each of the ordinary diode doping structures is formed on the insulation layer and is covered by the dielectric layer, each of the ordinary diode doping structures includes a P-type doped region and an N-type doped region that are in contact with each other, and each of the ordinary diode metal structures includes two metal pins; wherein in each of the ordinary diodes, the two metal pins of the ordinary diode metal structure are respectively formed on the dielectric layer and partially pass through the dielectric layer to be respectively and electrically connected to the P-type doped region and the N-type doped region of the ordinary diode doping structure; wherein each of the ordinary diodes is configured to receive a forward bias voltage when the power element is energized.

7. The power element according to claim 6, wherein each of the ordinary diodes is configured to be capable of withstanding a voltage between 0 volts and 0.7 volts, and each of the zener diodes is configured to be capable of withstanding a voltage between 5 volts and 6 volts.

8. The power element according to claim 4, further comprising: a plurality of ordinary diodes; wherein the plurality of the ordinary diodes and the plurality of the zener diodes are disposed in series with each other in a staggered manner on the insulation layer.

9. The power element according to claim 1, further comprising:
a resistor being located in the circuit element formation region and spaced apart from the plurality of zener diodes; wherein the resistor includes:
a resistor doping structure being formed on the insulation layer and covered by the dielectric layer; wherein the resistor doping structure is a P-type doped semiconductor or an N-type doped semiconductor; and
a resistor metal structure being formed on the dielectric layer and partially passing through the dielectric layer to be electrically connected to the resistor doping structure; wherein the resistor is configured to generate a resistance when the power element is energized.

10. The power element according to claim 1, further comprising: a plurality of normal diodes; wherein the plurality of normal diodes are disposed in series with each other and are all disposed on the insulation layer, the plurality of normal diodes are located in the circuit element formation region, the plurality of normal diodes are spaced apart from the plurality of zener diodes, and each of the normal diodes is configured to receive a forward bias voltage when the power element is energized.

* * * * *